US012628516B2

(12) United States Patent
Du et al.

(10) Patent No.: US 12,628,516 B2
(45) Date of Patent: May 12, 2026

(54) DISPLAY PANEL, DISPLAY MODULE AND MANUFACTURING METHOD THEREOF, AND DISPLAY DEVICE

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Yongqiang Du, Beijing (CN); Jizhe Wang, Beijing (CN); Ying Zhang, Beijing (CN); Zhihao Xie, Beijing (CN); Hengzhen Liang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 18/259,320

(22) PCT Filed: Jun. 29, 2022

(86) PCT No.: PCT/CN2022/102539
§ 371 (c)(1),
(2) Date: Jun. 26, 2023

(87) PCT Pub. No.: WO2024/000323
PCT Pub. Date: Jan. 4, 2024

(65) Prior Publication Data
US 2024/0389408 A1 Nov. 21, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/873* (2023.02); *H10K 2102/311* (2023.02)

(58) Field of Classification Search
CPC ............. H10K 59/131; H10K 59/1201; H10K 59/873; H10K 2102/311; H10K 50/80; H10K 59/82; G09F 9/30
See application file for complete search history.

(56) References Cited

U.S. PATENT DOCUMENTS 12,010,803 B2 * 6/2024 Zhu ........................ G06F 1/1652
12,284,868 B2 * 4/2025 Kim ..................... H10K 59/879
(Continued)

FOREIGN PATENT DOCUMENTS

CN 108847133 A 11/2018
CN 111063256 A 4/2020
(Continued)

OTHER PUBLICATIONS

PCT International Search Report (w/ English translation) and Written Opinion for corresponding Application No. PCT/CN2022/102539, mailed Mar. 22, 2023, 10 pages.

*Primary Examiner* — J. E. Schoenholtz
(74) *Attorney, Agent, or Firm* — Dority & Manning, P.A.

(57) ABSTRACT

A display panel has a display area and a peripheral area including: a first fan-out region, a bending region, and a second fan-out region. The display panel includes: a substrate layer, at least one connecting lead and at least one first-type signal line. The substrate layer includes a first substrate and a second substrate. The at least one connecting lead is between the first and second substrates and extends from a side of the bending region to another side of the bending region through the bending region. The at least one first-type signal line is located on a side of the second substrate away from the first substrate. A first-type signal (Continued)

line is in at least one of the first fan-out region or the display area. The first-type signal line is electrically connected to a connecting lead through a via hole in the second substrate.

19 Claims, 12 Drawing Sheets

(51) Int. Cl.
H10K 59/80 (2023.01)
H10K 102/00 (2023.01)

(56) References Cited

U.S. PATENT DOCUMENTS

| | | | |
|---|---|---|---|
| 2018/0081088 A1 | 3/2018 | Hwang et al. | |
| 2019/0095007 A1* | 3/2019 | Jeong ................... | H10K 59/131 |
| 2019/0144714 A1 | 5/2019 | Hu | |
| 2020/0074893 A1 | 3/2020 | Li et al. | |
| 2020/0183523 A1 | 6/2020 | Luo et al. | |
| 2021/0074731 A1* | 3/2021 | Cheng .................. | H10K 59/131 |
| 2021/0118343 A1* | 4/2021 | Im .......................... | H05K 1/028 |
| 2021/0336163 A1 | 10/2021 | Bai | |
| 2021/0408206 A1 | 12/2021 | Zeng et al. | |
| 2021/0408501 A1 | 12/2021 | Yu et al. | |
| 2022/0208945 A1* | 6/2022 | Lee ..................... | H10K 59/1315 |
| 2023/0023524 A1* | 1/2023 | Bae ........................ | H10K 59/65 |
| 2023/0217603 A1* | 7/2023 | Zhu ........................ | G06F 1/1652 |
| | | | 361/807 |
| 2025/0255153 A1* | 8/2025 | Kim ..................... | H10K 50/844 |
| 2025/0275368 A1* | 8/2025 | Lee .................... | H10D 86/0231 |

FOREIGN PATENT DOCUMENTS

| | | | | |
|---|---|---|---|---|
| CN | 111463243 A | * | 7/2020 | ............ H10D 86/60 |
| CN | 214476074 U | | 10/2021 | |
| CN | 113471258 B | | 4/2022 | |
| JP | 2013113481 A | | 6/2013 | |
| KR | 19990016664 A | | 3/1999 | |
| KR | 20090131903 A | | 12/2009 | |
| WO | WO2009093775 A1 | | 7/2009 | |

* cited by examiner

100

AA

BB

F1/BB

ZZ/BB

F2/BB

200

200

DISPLAY PANEL, DISPLAY MODULE AND MANUFACTURING METHOD THEREOF, AND DISPLAY DEVICE

CROSS-REFERENCE TO RELATED APPLICATION

This application is a national phase entry under 35 USC 371 of International Patent Application No. PCT/CN2022/102539 filed on Jun. 29, 2022, which is incorporated herein by reference in its entirety.

TECHNICAL FIELD

The present disclosure relates to the field of display technologies, and in particular, to a display panel, a display module and a manufacturing method thereof, and a display device.

BACKGROUND

The organic light-emitting diode (OLED) display device has a series of advantages of self-luminescence, fast response speed, high brightness, full viewing angle, applicable to flexible display, and the like, and thus becomes one of display devices with great competitiveness and development prospect.

SUMMARY

In an aspect, a display panel is provided. The display panel has a display area and a peripheral area. The peripheral area includes a first fan-out region, a bending region, and a second fan-out region that are arranged on a same side of the display area and away from the display area in sequence. The display panel includes: a substrate layer, at least one connecting lead and at least one first-type signal line. The substrate layer covers the display area and the peripheral area and includes a first substrate and a second substrate arranged in a stack. The at least one connecting lead is located between the first substrate and the second substrate and extends from a side of the bending region proximate to the first fan-out region to a side of the bending region proximate to the second fan-out region through the bending region. The at least one first-type signal line is located on a side of the second substrate away from the first substrate. A first-type signal line is located in at least one of the first fan-out region or the display area, and the first-type signal line is electrically connected to a connecting lead through a via hole in the second substrate.

In some embodiments, the substrate layer further includes a buffer layer arranged between the first substrate and the second substrate. The connecting lead is located between the buffer layer and the second substrate.

In some embodiments, the buffer layer has an accommodating structure. The accommodating structure has an opening provided in a surface of the buffer layer facing the second substrate, at least a portion of the accommodating structure is located in the bending region, and at least a portion of the connecting lead is located in the accommodating structure.

In some embodiments, the accommodating structure further has another opening provided in a surface of the buffer layer facing the first substrate.

In some embodiments, the accommodating structure includes a first side wall and a second side wall, where the first side wall is proximate to the first fan-out region, the second side wall is proximate to the second fan-out region, and the first side wall and the second side wall define an accommodating groove. The at least a portion of the connecting lead is located in the accommodating groove and is in contact with the first side wall, the second side wall and a portion of the first substrate exposed by the accommodating groove.

In some embodiments, the first side wall have slope angles being equal at various positions, and the second side wall have slope angles being equal at various positions.

In some embodiments, an edge of the first side wall proximate to the first substrate is a first edge, and an edge of the first side wall away from the first substrate is a second edge; and an edge of the second side wall proximate to the first substrate is a third edge, and an edge of the second side wall away from the first substrate is a fourth edge. A distance between the second edge and the fourth edge is greater than a distance between the first edge and the third edge.

In some embodiments, a surface of the second substrate away from the first substrate is a flat plane.

In some embodiments, the display panel further includes at least one gate metal layer, at least one source-drain metal layer and an anode layer that are located on the substrate layer. The first-type signal line is located in any one of the at least one gate metal layer, the at least one source-drain metal layer and the anode layer.

In some embodiments, the display panel further includes at least one second-type signal line located on a side of the second substrate away from the first substrate and located in the second fan-out region. A second-type signal line is electrically connected to the connecting lead through another via hole in the second substrate.

In some embodiments, a thickness of the first substrate is in a range of 8 μm to 10 μm, inclusive; and/or a thickness of the second substrate is in a range of 5 μm to 10 μm, inclusive.

In some embodiments, the first-type signal line is a data signal line, or a power signal line, or a touch lead.

In another aspect, a display module is provided. The display module includes the display panel as described in any of the above embodiments and a first optical adhesive layer. The first optical adhesive layer is located on a display side of the display panel. The first optical adhesive layer extends from the display area of the display panel to the second fan-out region through the first fan-out region and the bending region.

In some embodiments, the display panel further includes a fifth edge located at a side of the second fan-out region away from the bending region, and the first optical adhesive layer includes a sixth edge proximate to the fifth edge. A distance between an orthographic projection of the sixth edge on the display panel and the fifth edge is in a range of 0.1 mm to 0.25 mm, inclusive.

In some embodiments, the display module further includes: a color filter layer and a protective cover plate. The color filter layer is located between the display panel and the first optical adhesive layer, where at least the display area is within an orthographic projection of the color filter layer on the display panel. The protective cover plate is located on a side of the first optical adhesive layer away from the display panel.

In some embodiments, the display module further includes: a polarizer, a second optical adhesive layer and a protective cover plate. The polarizer is located on a side of the first optical adhesive layer away from the display panel, where at least the display area is within an orthographic projection of the polarizer on the display panel. The second optical adhesive layer is located on a side of the polarizer away from the first optical adhesive layer. The protective cover plate is located on a side of the second optical adhesive layer away from the polarizer.

In some embodiments, the display panel further includes a fifth edge located a side of the second fan-out region away from the bending region; and the polarizer includes a seventh edge proximate to the fifth edge, and the second optical adhesive layer includes an eighth edge proximate to the fifth edge, where the eighth edge is closer to the display area than the seventh edge, and a distance between an orthographic projection of the seventh edge on the display panel and an orthographic projection of the eighth edge on the display panel is in a range of 0.1 mm to 0.25 mm, inclusive.

In some embodiments, the display panel includes a first portion located in the display area and the first fan-out region, a second portion located in the bending region, and a third portion located in the second fan-out region, where the second portion is connected between the first portion and the third portion, and the first portion is arranged opposite to the third portion. The display module further includes: a back film, a support layer and a bending cushion block. The back film is located on a non-display side of the display panel, where the non-display side is a side opposite to the display side; the back film includes a first sub-film and a second sub-film, where the first sub-film at least covers the first portion, and the second sub-film at least covers the third portion; and the first sub-film and the second sub-film have a gap therebetween, and in a direction perpendicular to the second portion, the gap at least partially overlaps the bending region. The support layer is located between the first sub-film and the second sub-film. The bending cushion block is located between the support layer and the second sub-film.

In still another aspect, a manufacturing method of a display module is provided. The display module includes a display panel; the display panel has a display area and a peripheral area, where the peripheral area includes a first fan-out region, a bending region, and a second fan-out region that are arranged on a same side of the display area and away from the display area in sequence, and the display panel includes a first portion located at a side of the bending region proximate to the display area, a second portion located in the bending region, and a third portion located at a side of the bending region away from the display area. The manufacturing method includes: attaching a first optical adhesive layer to a display side of the display panel, where the first optical adhesive layer extends from the display area of the display panel to the second fan-out region through the first fan-out region and the bending region; bending the second portion of the display panel to arrange the third portion of the display panel on a back side of the first portion of the display panel; and performing a light curing on at least a portion of the first optical adhesive layer located in the bending region.

In still another aspect, a display device is provided. The display device includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
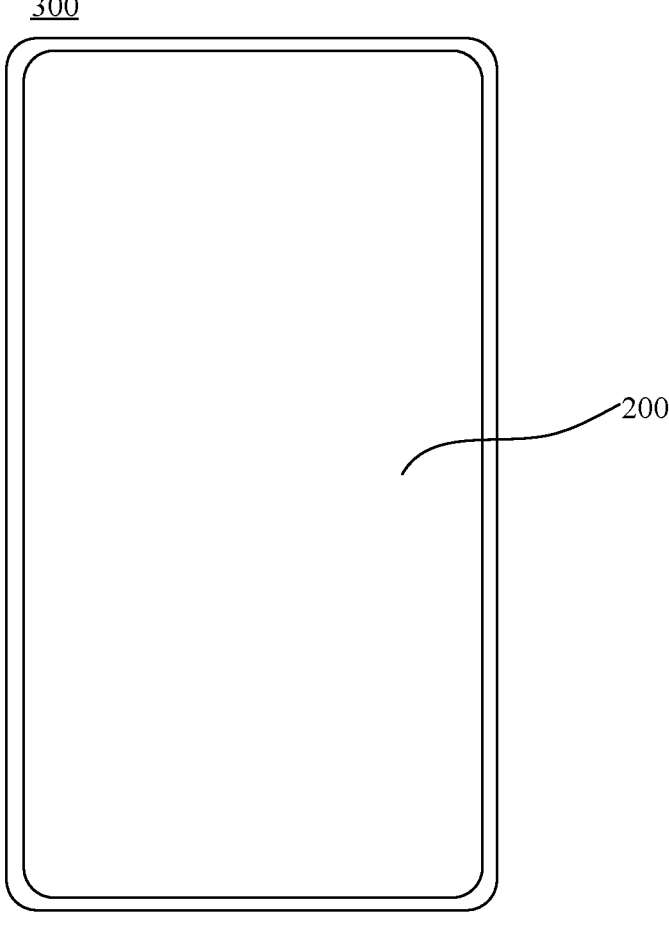
FIG. 1 is a structural diagram of a display device provided in some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or example(s). In addition, the specific features, structures, materials or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, the term "a plurality of/the plurality of/multiple" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined . . . " or "if [a stated condition or event] is detected" is optionally construed as "in a case where it is determined . . . ", "in response to determining . . . ", "in a case where [the stated condition or event] is detected" or "in response to detecting [the stated condition or event]".

In addition, the use of the phrase "based on" is meant to be open and inclusive, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

It will be understood that, in a case where a layer or component is referred to as being on another layer or a substrate, it may be that the layer or component is directly on the another layer or substrate; or it may be that intermediate layer(s) exist between the layer or component and the another layer or substrate.

It will be understood that in the embodiments of the present disclosure, the "electrically connected" may be directly connected or may be indirectly connected through other traces.

Exemplary embodiments are described herein with reference to section views and/or plan views as idealized exemplary drawings. In the accompanying drawings, thicknesses of layers and sizes of regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle shape generally has a curved feature. Therefore, the regions shown in the accompanying drawings are schematic in nature, and their shapes are not intended to show actual shapes of regions in a device, and are not intended to limit the scope of the exemplary embodiments.

FIG. 1 is a structural diagram of a display device provided in some embodiments of the present disclosure. Referring to FIG. 1, some embodiments of the present disclosure provide a display device 300, and the display device 300 includes a display module 200.

It can be understood that the display device 300 is a product having an image display function. For example, the display device 300 may be any apparatus that is capable of displaying images whether in motion (e.g., videos) or stationary (e.g., static images), and whether literal or graphical. More specifically, it is expected that the embodiments may be implemented in or associated with a plurality of electronic devices. The plurality of electronic devices may include (but is not limit to), for example, a mobile telephone, a wireless device, a personal data assistant (PDA), a handheld or portable computer, a GPS receiver/navigator, a camera, an MP4 video player, a video camera, a game console, a watch, a clock, a calculator, a TV monitor, a flat panel display, a computer monitor, a car display (such as an odometer display), a navigator, a cockpit controller and/or display, a camera view display (such as a rear view camera display in vehicles), an electronic photo, an electronic billboard or indicator, a projector, a building structure, and a packaging and aesthetic structure (such as a display for an image of a piece of jewelry).

Figure 2:
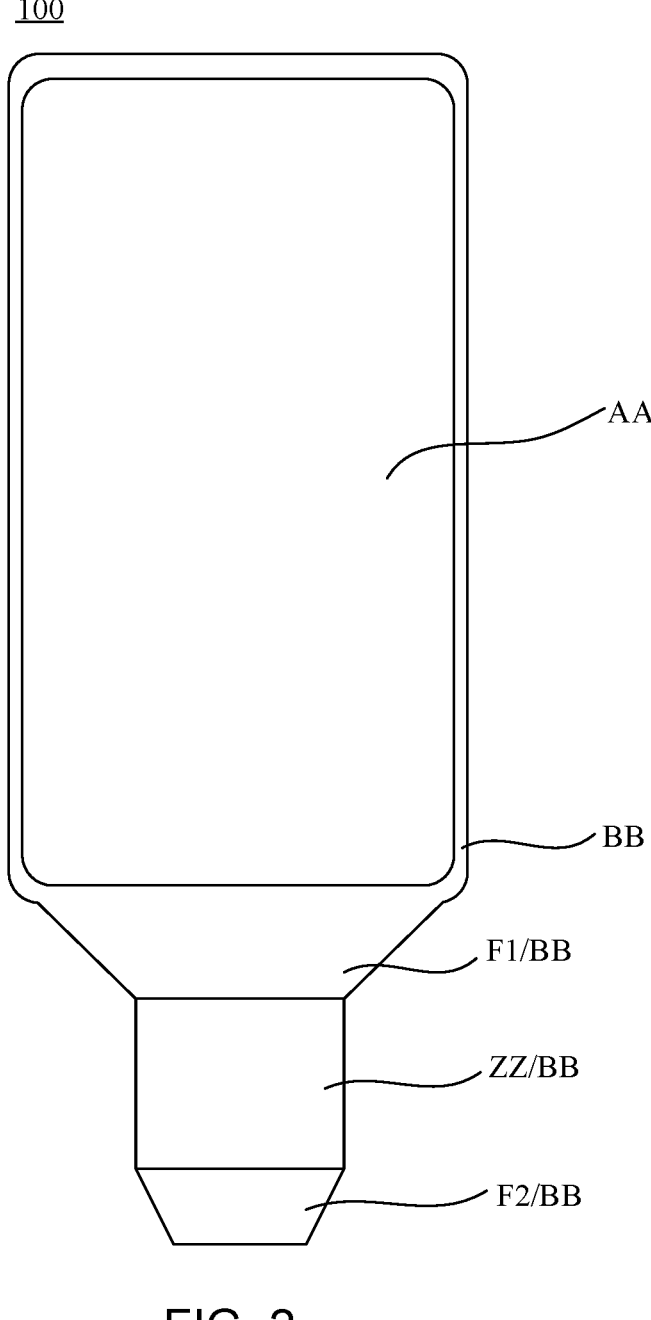
FIG. 2 is a structural diagram of a display panel provided in some embodiments of the present disclosure.

FIG. 2 is a structural diagram of a display panel provided in some embodiments of the present disclosure. In some embodiments, as shown in FIG. 2, the display module 200 includes a display panel 100.

In addition, the display module 200 may further include an under-screen camera, an under-screen fingerprint recognition sensor, and the like, enabling the display device to perform a variety of different functions such as photography, video recording, fingerprint recognition or face recognition.

In some examples, the display panel 100 is an organic light-emitting diode display (OLED) or a quantum dot electroluminescent display (quantum dot light-emitting diode QLED).

For example, the display panel 100 may include functional film layers, such as a touch functional layer, an anti-reflection layer, an anti-fingerprint layer, a hardening layer, and an encapsulating cover plate, so that the display panel 100 can implement different functions.

Figure 3:
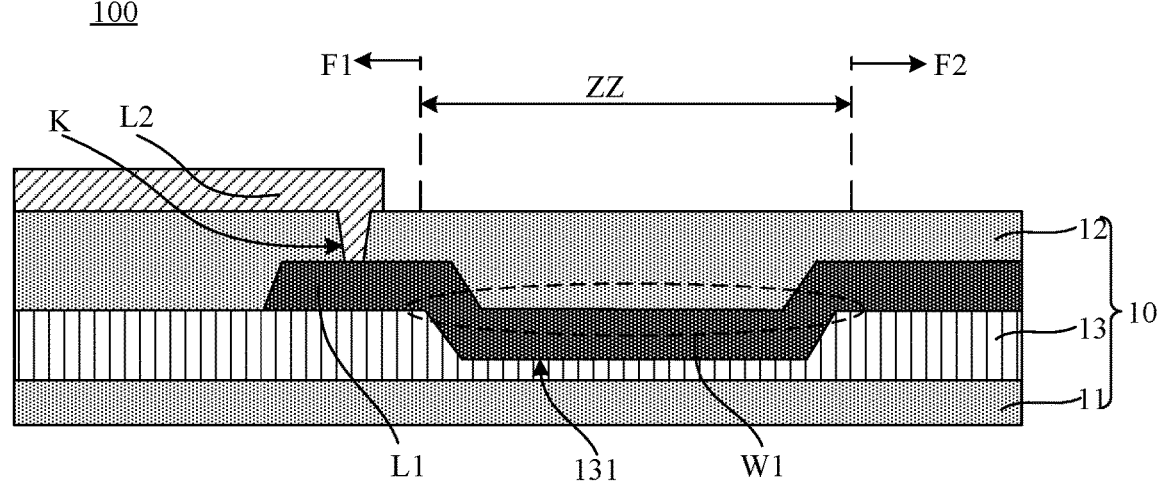
FIG. 3 is a section view of a display panel provided in some embodiments of the present disclosure.

FIG. 3 is a section view of a display panel provided in some embodiments of the present disclosure. In some embodiments, referring to FIG. 3 and in conjunction with FIG. 2, the display panel 100 has a display area AA (active area AA, also referred to as an effective display area) and a peripheral area BB. The peripheral area BB includes: a first fan-out region F1, a bending region ZZ, and a second fan-out region F2 that are arranged on a same side of the display area AA and away from the display area AA in sequence.

The display panel 100 includes a substrate layer 10, at least one connecting lead L1, and at least one first-type signal line L2. For example, a first-type signal line L2 may be any one of a data signal line, a power signal line, or a touch lead.

The substrate layer 10 covers the display area AA and the peripheral area BB. The substrate layer 10 includes a first substrate 11 and a second substrate 12 which are arranged in a stack.

In some examples, materials of the first substrate 11 and the second substrate 12 are both flexible materials, so that the display panel 100 can be bent, thereby enabling the display panel 100 to implement functions such as a curved display, a folded display, or a scrolling display.

For example, a material of the first substrate 11 may be any one of polyimide (PI), polycarbonate (PC) or polyvinyl chloride (PVC).

For example, a material of the second substrate 12 may be any one of polyimide (PI), polycarbonate (PC) or polyvinyl chloride (PVC).

Here, in some embodiments, the material of the first substrate 11 and the material of the second substrate 12 may be same. In some other embodiments, the material of the first substrate 11 and the material of the second substrate 12 may be different.

For the at least one connecting lead L1, the connecting lead L1 is located between the first substrate 11 and the second substrate 12. The connecting lead L1 extends from a side of the bending region ZZ proximate to the first fan-out region F1 to a side of the bending region proximate ZZ to the second fan-out region F2 through the bending region.

A first-type signal line L2 is located on a side of the second substrate 12 away from the first substrate 11 and is located in the first fan-out region F1 and/or the display area AA. The first-type signal line L2 is electrically connected to a connecting lead L1 through a via hole K in the second substrate 12.

For example, the first-type signal line L2 may be any one of a data signal line, a voltage signal line, a clock signal line, or a touch signal line. One end of the first-type signal line L2 is electrically connected to the connecting lead L1 through the via hole K. In a case where the first-type signal line L2 is a data signal line or a voltage signal line, the other end of the first-type signal line L2 may be electrically connected to sub-pixels in the display area AA. In a case where the first-type signal line L2 is a clock signal line, the other end of the first-type signal line L2 may be electrically connected to a gate driver circuit located in the peripheral area (located in portions of the peripheral area at the left and right of the display area AA shown in FIG. 2). In a case where the first-type signal line L2 is a touch signal line, the other end of the first-type signal line L2 may be electrically connected to the touch functional layer of the display panel 100.

For example, there are several ways to achieve "the first-type signal line L2 being located in the first fan-out region F1 and/or the display area AA". In a first way, the first-type signal line L2 may be located in the display area AA and extend to the first fan-out region F1, and then may be electrically connected to the connecting lead L1 through a via hole K located in the first fan-out F1. In a second way, the first-type signal line L2 is located in the display area AA, and then may be electrically connected to the connecting lead L1 through a via hole K located in the display area AA. In a third way, the first-type signal line L2 is located only in the first fan-out region F1, and then may be electrically connected to the connecting lead L1 through a via hole K located in the first fan-out F1. The first-type signal line L2 may also be electrically connected to a signal line in the display area AA through a via hole.

In these embodiments, the first-type signal line L2 is electrically connected to the connecting lead L1 through the via hole K, and the connecting lead L1 is located in the bending region ZZ. The connecting lead L1 is located between the first substrate 11 and the second substrate 12 in the bending region ZZ, so that the connecting lead L1 is proximate to a neutral layer (i.e., a layer that does not generate strain in the bending). During the bending of the display panel 100, it is beneficial to reduce the tensile stress applied to the connecting lead L1 in the bending region ZZ, thus reducing the risk of breakage of the connecting lead L1 and improving the yield of the display panel 100. In addition, the connecting lead L1 is located between the first substrate 11 and the second substrate 12, and the first substrate 11 and the second substrate 12 can block water and oxygen, so that the connecting lead L1 can be prevented from being corroded by water and oxygen.

In some implementations, a connecting lead is arranged on a side of a conductive layer to which a first-type signal line belongs, which is away from a substrate layer. A distance between the connecting lead and a neutral layer is large, which increases the tensile stress applied to the connecting lead during the bending process of the display panel, i.e. increases the risk of breakage of the connecting lead. In contrast, the present disclosure provides the embodiments in which the connecting lead L1 is arranged between the first substrate 11 and the second substrate 12, and the connecting lead L1 is closer to the neutral layer. The tensile stress applied to the connecting lead L1 in the bending region ZZ during the bending process of the display panel 100 is effectively reduced, so that the risk of breakage of the connecting lead L1 is reduced, and the yield of the display panel 100 is improved.

In some embodiments, referring to FIG. 3, the first substrate 11 has a thickness of 8 μm to 10 μm, inclusive; and/or the second substrate 12 has a thickness of 5 μm to 10 μm, inclusive.

In a first case, the first substrate 11 has a thickness of 8 μm to 10 μm, inclusive. It is possible to avoid the influence of the excessive thickness on the thinness of the display panel 100 while satisfying the good extension performance of the first substrate 11. For example, the thickness of the first substrate 11 is any of 8 μm, 9 μm, or 10 μm.

In a second case, the second substrate 12 has a thickness of 5 μm to 10 μm, inclusive. It is possible to avoid the influence of the excessive thickness on the thinness of the display panel 100 while satisfying the good extension performance of the second substrate 12. For example, the thickness of the second substrate 12 is any of 5 μm, 7 μm, or 9 μm.

In a third case, the first substrate 11 has a thickness of 8 μm to 10 μm, inclusive, and the second substrate 12 has a thickness of 5 μm to 10 μm, inclusive. It is possible to avoid the influence of the excessive thickness on the thinness of the display panel 100 while satisfying the good extension performance of the first substrate 11 and the second substrate 12.

In some embodiments, with continuous reference to FIG. 3, the substrate layer 10 further includes a buffer layer 13. The buffer layer 13 is arranged between the first substrate 11 and the second substrate 12, where the connecting lead L1 is located between the buffer layer 13 and the second substrate 12.

For example, a material of the buffer layer 13 includes silicon oxide (SiOx) and silicon nitride (SiNx). The buffer layer 13 may function to support the first substrate 11 and the second substrate 12. In the above-described embodiments, the connecting lead L1 is provided between the buffer layer 13 and the second substrate 12. The connecting lead L1 is closer to the neutral layer (i.e. the layer without generating strain during bending) than the first-type signal line L2, so that the tensile stress applied to the connecting lead L1 in the bending region ZZ during the bending process of the display panel 100 is reduced, the risk of breakage of the connecting lead L1 is reduced, and the yield of the display panel 100 is improved.

In some embodiments, with continued reference to FIG. 3, the buffer layer 13 in the display panel 100 has an accommodating structure 131 therein. The accommodating structure 131 has an opening W1 provided in a surface of the buffer layer 13 facing the second substrate 12. At least a portion of the accommodating structure 131 is located in the bending region ZZ. At least a portion of the connecting lead L1 is located in the accommodating structure 131.

In these embodiments, the buffer layer 13 has an accommodating structure 131 therein. The accommodating structure 131 has the opening W1 provided in the surface of the buffer layer 13 facing the second substrate 12. FIG. 3 shows an example in which the entire accommodating structure 131 is located in the bending region ZZ. In other embodiments, an edge of an orthographic projection of the accommodating structure 131 on the first substrate 11 coincides with an edge of the bending region. In still other embodiments, the accommodating structure 131 may extend outward to the first fan-out region F1 and/or the second fan-out region F2. The at least a portion of the accommodating structure 131 is located in the bending region ZZ, which can release stress of the bending region ZZ, so as to reduce a probability that the connecting lead L1 is broken in the bending region ZZ, and resolve a problem that the first-type signal line L2 is broken in the bending region ZZ. Moreover, the accommodating structure 131 has the opening W1 provided in the surface of the buffer layer 13 facing the second substrate 12. After the display panel 100 is bent, the connecting lead L1 may be closer to the neutral layer, that is, the connecting lead L1 is closer to the layer which is neither pressed nor stretched. Therefore, the tensile stress applied to the connecting lead L1 in the bending region ZZ during the bending process of the display panel 100 is reduced, the risk of breakage of the connecting lead L1 is reduced, and the yield of the display panel 100 is improved.

In some examples, with continued reference to FIG. 3, the accommodating structure 131 has the opening W1 provided in the surface of the buffer layer 13 facing the second substrate 12, and the accommodating structure 131 has no opening provided in a surface of the buffer layer 13 facing the first substrate 11. In this case, the accommodating structure 131 does not penetrate the buffer layer 13. The accommodating structure 131 can be understood as a recess etched in the buffer layer 13. The at least a portion of the connecting lead L1 is located in the accommodating structure 131, such that the connecting lead L1 may be closer to the neutral layer. The tensile stress applied to the connecting lead L1 in the bending region ZZ during the bending process of the display panel 100 is reduced, so that the risk of breakage of the connecting lead L1 is reduced, and the yield of the display panel 100 is improved.

Figure 4:
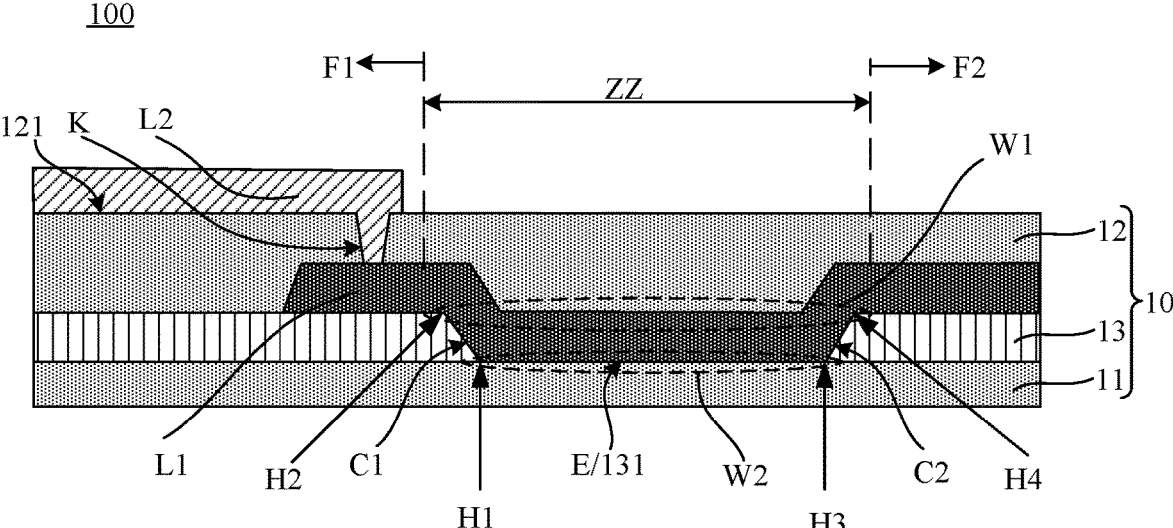
FIG. 4 is a section view of a display panel provided in some other embodiments of the present disclosure.

FIG. 4 is a section view of a display panel provided in some other embodiments of the present disclosure. In some examples, referring to FIG. 4, the accommodating structure 131 has the opening W1 provided in the surface of the buffer layer 13 facing the second substrate 12, and the accommodating structure 131 further has an opening provided in a surface of the buffer layer 13 facing the first substrate 11.

In the above examples, the accommodating structure 131 penetrates the buffer layer 13, and the at least a portion of the connecting lead L1 is located in the accommodating structure 131. The accommodating structure 131 may allow the connecting lead L1 to be closer to the neutral layer than the accommodating structure shown in FIG. 3 that does not penetrate the buffer layer 13. The tensile stress applied to the connecting lead L1 in the bending region ZZ during the bending process of the display panel 100 is reduced, so that the risk of breakage of the connecting lead L1 is reduced, and the yield of the display panel 100 is improved.

In some embodiments, with continued reference to FIG. 4, the accommodating structure 131 includes a first side wall C1 and a second side wall C2, the first side wall C1 is proximate to the first fan-out region F1, the second side wall C2 is proximate to the second fan-out region F2, and the first side wall C1 and the second side wall C2 define an accommodating groove E. The at least a portion of the connecting lead L1 is located in the accommodating groove E and in contact with a portion of the first substrate 11 exposed by the first side wall C1, the second side wall C2 and the accommodating groove E.

In the above example, the accommodating structure 131 penetrates the buffer layer 13 and exposes the first substrate 11, such that the first side wall C1 of the accommodating structure 131, the first substrate 11 and the second side wall C2 of the accommodating structure 131 define the accommodating groove E. The at least a portion of the connecting lead L1 is located in the accommodating groove E, that is, the at least a portion of the connecting lead L1 is located on the portion of the first substrate 11 exposed by the first side wall C1, the second side wall C2 and the accommodating groove E. As a result, the connecting lead L1 is closer to the neutral layer, which is favorable for reducing the tensile stress in the bending region ZZ during the bending process of the display panel 100 applied to the connecting lead L1, thereby reducing the risk of breakage of the connecting lead L1 and improving the yield of the display panel 100.

In some embodiments, with continued reference to FIG. 4, an edge of the first side wall C1 proximate to the first substrate 11 is a first edge H1, and an edge of the first side wall C1 away from the first substrate 11 is a second edge H2; an edge of the second side wall C2 proximate to the first substrate 11 is a third edge H3, and an edge of the second side wall C2 away from the first substrate 11 is a fourth edge H4; and a distance between the second edge H2 and the fourth edge H4 is greater than a distance between the first edge H1 and the third edge H3.

In these embodiments, the distance between the second edge H2 and the fourth edge H4 is greater than the distance between the first edge H1 and the third edge H3. That is, a dimension of the accommodating structure 131 proximate to the first substrate 11 is less than a dimension of the accommodating structure 131 away from the first substrate 11. The accommodating structure 131 may have an inverted trapezoidal shape in cross section as shown in FIG. 4. As with the shape of the accommodating structure 131 above, the formation of the connecting lead L1 on a side of the buffer layer 13 away from the first substrate 11 is facilitated, a problem of breakage of the connecting lead L1 caused by a case that the dimension of the accommodating structure 131 proximate to the first substrate 11 is greater than the dimension of the accommodating structure 131 away from the first substrate 11 is prevented, and the yield of the display panel 100 is improved.

In some examples, slope angles of the first side wall C1 at various positions are equal, so that a surface of the first side wall C1 can be made flat, which is beneficial to forming the connecting lead L1 on the side of the buffer layer 13 away from the first substrate 11, and preventing the connecting lead L1 from breaking.

In some examples, slope angles of the second side wall C2 at various positions are equal, so that a surface of the second side wall C2 can be made flat, which is beneficial to forming the connecting lead L1 on the side of the buffer layer 13 away from the first substrate 11, and preventing the connecting lead L1 from breaking.

In some examples, slope angles of the first side wall C1 gradually increase along a direction from the first substrate 11 to the second substrate 12, so that a change of a surface of the first side wall C1 can be smooth, which is beneficial to forming the connecting lead L1 on the side of the buffer layer 13 away from the first substrate 11, and preventing the connecting lead L1 from breaking.

In some examples, slope angles of the second side wall C2 gradually increase along a direction from the first substrate 11 to the second substrate 12, so that a change of a surface of the second side wall C2 can be smooth, which is beneficial to forming the connecting lead L1 on the side of the buffer layer 13 away from the first substrate 11, and preventing the connecting lead L1 from breaking.

In some embodiments, with continued reference to FIG. 4, a surface 121 of the second substrate 12 away from the first substrate 11 may be a flat plane. A portion of the second substrate 12 proximate to the accommodating structure 131 fills the recess formed by the accommodating structure 131, so that the surface 121 of the second substrate 12 away from the first substrate 11 forms the flat plane. As a result, subsequent formations of various film layers in the display panel 100 on the second substrate 12 are facilitated, and the yield of the display panel 100 is improved.

Figure 5:
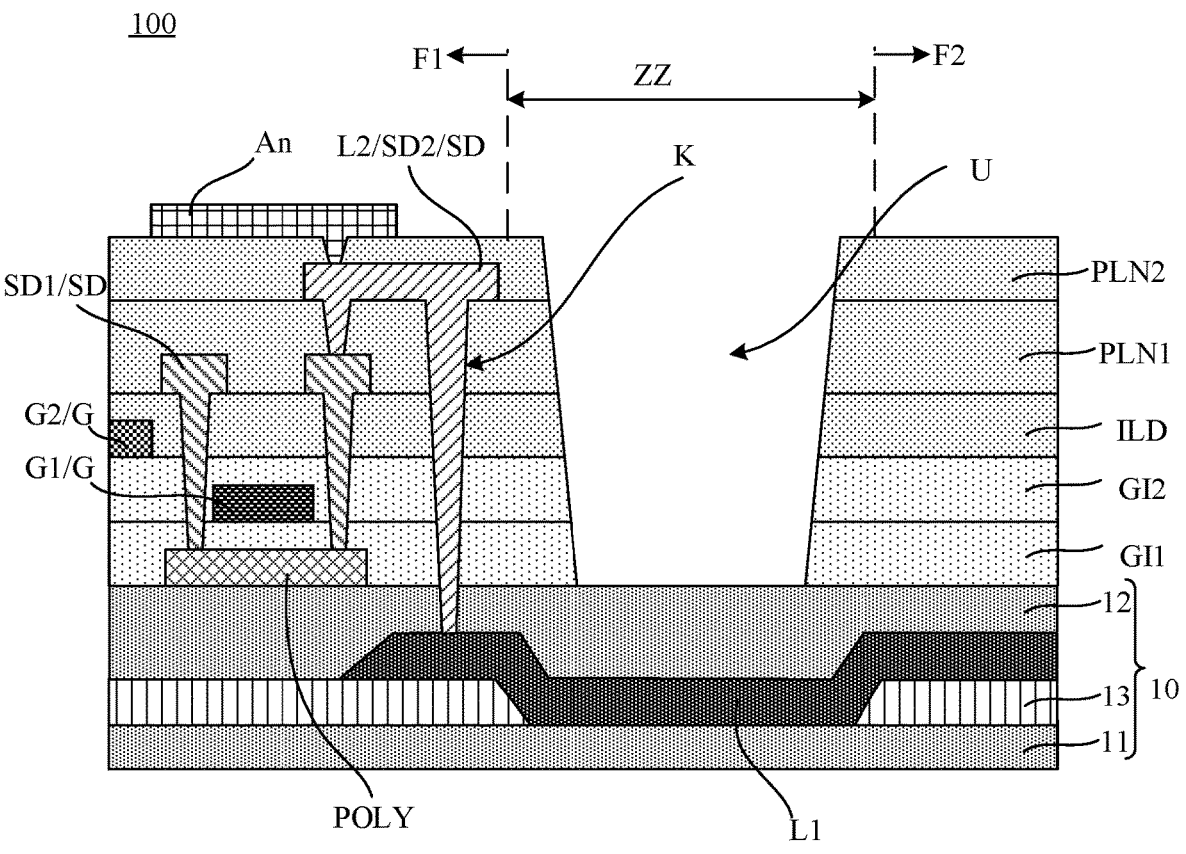
FIG. 5 is a section view of a display panel provided in some still other embodiments of the present disclosure.

FIG. 5 is a section view of a display panel provided in some still other embodiments of the present disclosure. In some embodiments, referring to FIG. 5, the display panel 100 further includes: at least one gate metal layer G, at least one source-drain metal layer SD and an anode layer An, which are located on the substrate layer 10. The first-type signal line L2 is located in any one of the at least one gate metal layer G, the at least one source-drain metal layer SD, and the anode layer An. FIG. 5 shows an example in which the first-type signal line L2 is located in a second source-drain metal layer SD2 in the at least one source-drain metal layer SD.

In some examples, an active layer POLY, a first gate metal layer G1, a second gate metal layer G2, a first source-drain metal layer SD1, and the second source-drain metal layer SD2 are stacked on the substrate layer 10. Light-emitting devices located on the second source-drain metal layer SD2 may also be included in the display panel. The light-emitting device may include an anode of the anode layer An, a light-emitting layer and a cathode of a cathode layer that are sequentially stacked along a direction away from the first substrate 11.

Furthermore, in some examples, the at least one gate metal layer G may further include a third gate metal layer (not shown in the figures). For example, the first gate metal layer G1, the second gate metal layer G2, the third gate metal layer, the first source-drain metal layer SD1, and the second source-drain metal layer SD2 may be sequentially stacked in a direction away from the first substrate 11.

In these embodiments, the first-type signal line L2 is located in any one of the at least one gate metal layer G, the at least one source-drain metal layer SD, and the anode layer An. The first-type signal line L2 may be located in any one of the above-described conductive layers. It can be understood that a signal line in any one of the gate metal layer G, the source-drain metal layer SD and the anode layer An may be connected to the connecting lead L1 through the via hole K. Since the connecting lead L1 is located between the first substrate 11 and the second substrate 12, it is closer to the neutral layer than the signal line located in any one of the gate metal layer G, the source-drain metal layer SD and the anode layer An, so as to reduce the risk of breakage of the connecting lead L1 and improve the yield of the display panel 100.

In some examples, as shown in FIG. 5, the display panel 100 further includes a plurality of insulating layers, which include a first gate insulating layer GI1, a second gate insulating layer GI2, an interlayer dielectric layer ILD, a first planarization layer PLN1, and a second planarization layer PLN2.

The first gate insulating layer GI1 is located between the active layer POLY and the first gate metal layer G1 to insulate the active layer POLY from the first gate metal layer G1. A material of the first gate insulating layer GI1 may include any one of inorganic insulating materials such as silicon nitride, silicon oxynitride and silicon oxide. For example, the material of the first gate insulating layer GI1 may include silicon dioxide, and the present disclosure is not limited thereto.

The second gate insulating layer GI2 is located between the first gate metal layer G1 and the second gate metal layer G2 to insulate the first gate metal layer G1 from the second gate metal layer G2. A material of the second gate insulating layer GI2 may include any one of inorganic insulating materials such as silicon nitride, silicon oxynitride and silicon oxide. For example, the material of the second gate insulating layer GI2 may include silicon dioxide, and the present disclosure is not limited thereto.

The interlayer dielectric layer ILD is located between the second gate metal layer G2 and the first source-drain metal layer SD1 to insulate the second gate metal layer G2 from the first source-drain metal layer SD1.

The first planarization layer (PLN for short) PLN1 is located between the first source-drain metal Layer SD1 and the second source-drain metal Layer SD2 to insulate the first source-drain metal layer SD1 from the second source-drain metal layer SD2. For example, a material of the first planarization layer PLN1 may include an organic material such as resin.

The second planarization layer (PLN for short) PLN2 is located between the second source-drain metal layer SD2 and the anode layer An to insulate the second source-drain metal Layer SD2 from the anode layer An. For example, a material of the second planarization layer PLN2 may be an organic material including resin.

In some examples, as shown in FIG. 5, the display panel 100 further includes a trench U. The trench U is located in the bending region ZZ, and the trench U penetrates through the first gate insulating layer GI1, the second gate insulating layer GI2, and the interlayer insulating layer ILD. Since the materials of the first gate insulating layer GI1, the second gate insulating layer GI2, and the interlayer insulating layer ILD are generally inorganic materials, which have large brittleness. The trench U is provided to prevent the insulating layers from being broken when the insulating layers are bent, thereby improving the yield of the display panel 100.

For example, the trench U may be filled with an organic material. The organic material is used for releasing the stress of the bending region ZZ, and is beneficial to improving the bending performance of the display panel 100 in the bending region ZZ. For example, the organic material may include one or more of a polyacrylate-based resin, a polyimide-based resin, a polyamide-based resin, a siloxane-based resin, an acryl-based resin, and an epoxy-based resin. For example, a portion of the first planarization layer PLN1 may be filled into the trench U, and the stress of the bending region ZZ is released by the first planarization layer PLN1, which is beneficial to improve the bending performance of the display panel 100 in the bending region ZZ.

Figure 6:
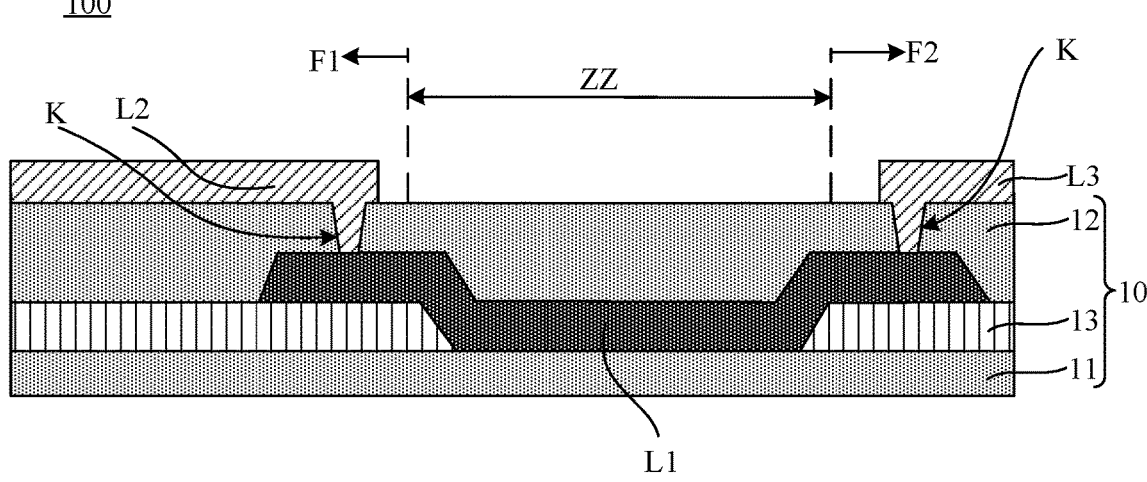
FIG. 6 is a section view of a display panel provided in some still other embodiments of the present disclosure.

FIG. 6 is a section view of a display panel provided in some still other embodiments of the present disclosure. In some embodiments, referring to FIG. 6, the display panel 100 further includes at least one second-type signal line L3. The second-type signal line L3 is located on a side of the second substrate 12 away from the first substrate 11 and is located in the second fan-out F2. The second-type signal line L3 is electrically connected to the connecting lead L1 through a via hole K in the second substrate 12.

The first-type signal line L2 is electrically connected to the connecting lead L1 through a via hole K, and the second-type signal line L3 is electrically connected to the connecting lead L1 through another via hole K. It can be understood that the first-type signal line L2 and the second-type signal line L3 are electrically connected by the connecting lead L1. The first-type signal line L2 and the second signal line L3 are both located on the side of the second substrate 12 away from the first substrate 11. The electrical connection is made by using the connecting lead L1, and the connecting lead L1 is located between the first substrate 11 and the second substrate 12. Since the connecting lead L1 is closer to the neutral layer, the tensile stress applied to the connecting lead L1 in the bending region ZZ during the bending process of the display panel 100 is reduced, so that the risk of breakage of the connecting lead L1 is reduced, a signal transmission between the first-type signal line L2 and the second-type signal line L3 is ensured, and the yield of the display panel 100 is improved.

In some examples, the second-type signal line L3 is located in any one of the at least one gate metal layer G, the at least one source-drain metal layer SD, and the anode layer An.

In some examples, with continued reference to FIG. 6, the first-type signal line L2 and the second-type signal line L3 are arranged in a same layer. It can be understood that in some other embodiments, the first-type signal line L2 and the second-type signal line L3 are located in different layers.

Figure 7:
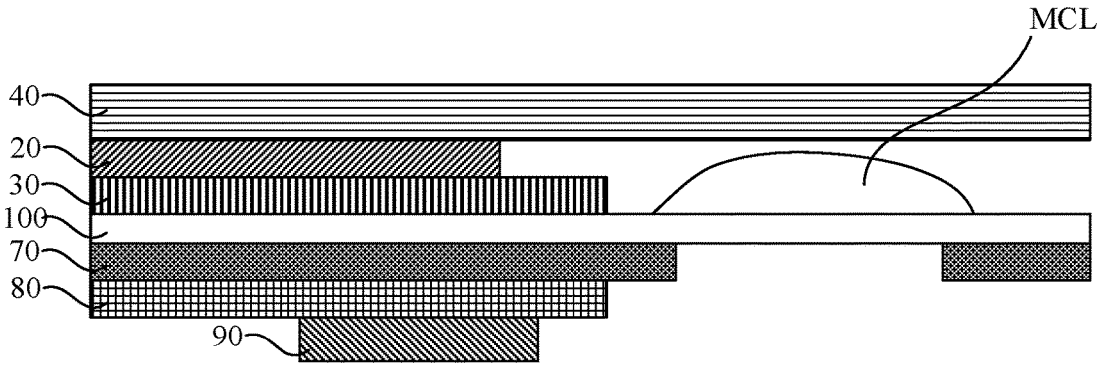
FIG. 7 is a section view of a display module in some implementations.
Figure 8:
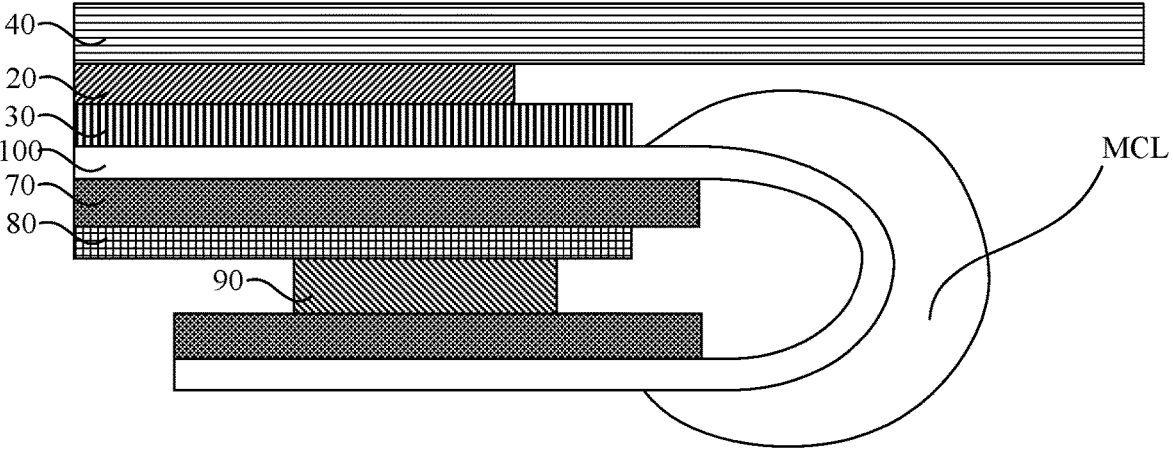
FIG. 8 is a section view of a display module in some other implementations.
Figure 9:
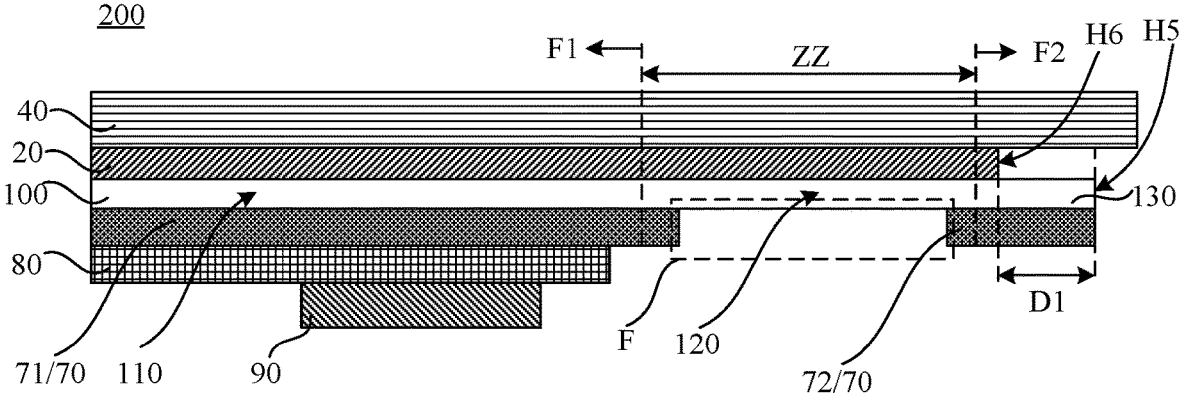
FIG. 9 is a section view of a display module provided in some embodiments of the present disclosure.
Figure 10:
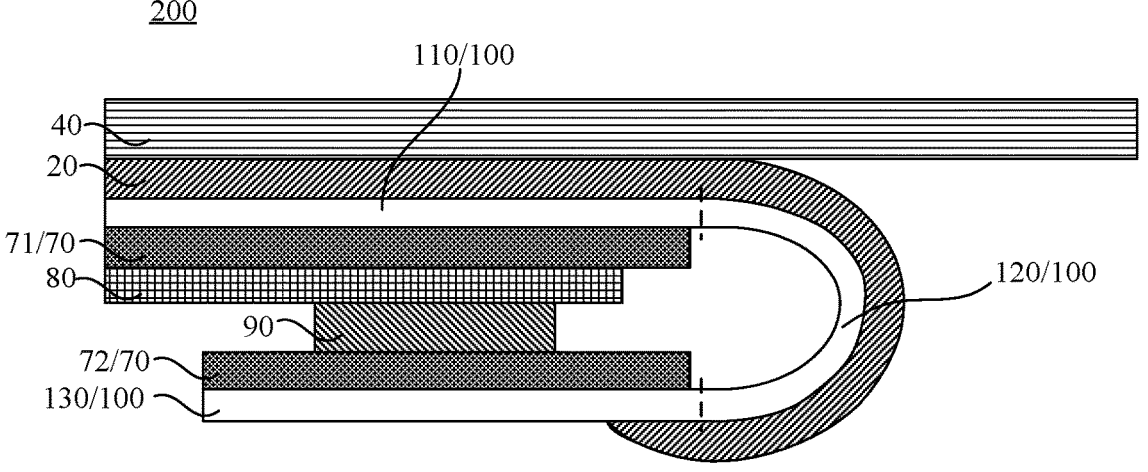
FIG. 10 is a section view of a display module provided in some other embodiments of the present disclosure.
Figure 11:
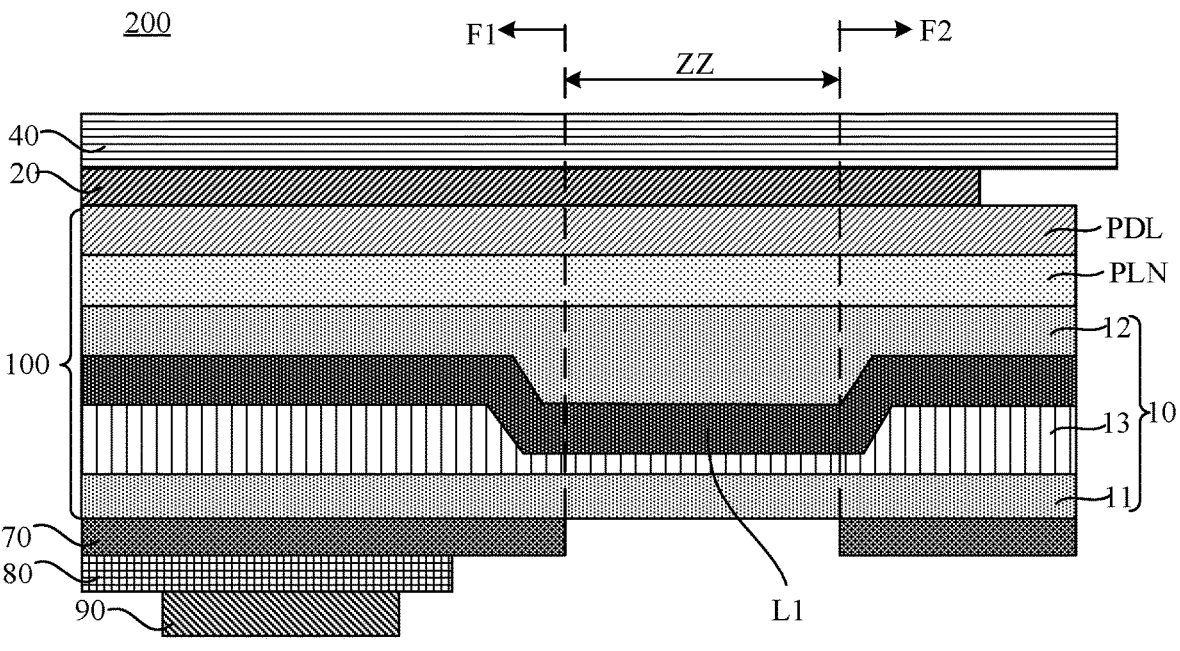
FIG. 11 is a section view of a display module provided in some still other embodiments of the present disclosure.

FIG. 7 is a section view of a display module in some implementations. FIG. 8 is a section view of a display module in some other implementations. FIG. 9 is a section view of a display module provided in some embodiments of the present disclosure. FIG. 10 is a section view of a display module provided in some other embodiments of the present disclosure. FIG. 11 is a section view of a display module provided in some still other embodiments of the present disclosure. Display panels 100 in display modules 200 as shown in FIGS. 7 and 9 are in an unbent state, and display panels 100 in display modules 200 as shown in FIGS. 8 and 10 are in a bent state. FIG. 11 shows an arrangement manner of structures within a display panel in a display module as shown in FIG. 9 in detail.

In some implementations, referring to FIGS. 7 and 8, a display module 200 includes a display panel 100, and a first optical adhesive layer 20 and a protective cover plate 40 sequentially arranged on a display side of the display panel 100. The display module 200 further includes a back film 70, a support layer 80, and a bending cushion block 90, which are located on a non-display side of the display panel 100. The non-display side is opposite to the display side. In order to prevent the breakage of signal lines in the bending region ZZ during the bending process of the display panel 100. A side of the display panel 100 proximate to the protective cover plate 40 is coated with an MCL (metal cover layer) adhesive Layer. However, the MCL adhesive layer has poor thickness uniformity, which reduces the process yield of the display module 200; and a thickness of the MCL adhesive layer is too large, generally 90 μm to 120 μm, which cause a significant difference with respect to a thickness of 30 μm of the display panel 100, as a result, a lower frame of the display module 200 is easily enlarged after the display module 200 is bent. Moreover, in a limited space, since the MCL adhesive layer has a relatively large thickness, a bending radius of the display panel 100 may be decreased. The less the bending radius, the greater the tensile stress on the signal lines in the bending region ZZ of the display panel 100, which further increases the risk of breaking the connecting lead L1 in the bending region ZZ.

A display module 200 provided in some embodiments of the present disclosure, referring to FIGS. 9 and 10, includes the display panel 100 in any of the above embodiments, and further includes a first optical adhesive layer 20. The first optical adhesive layer 20 is located on a display side of the display panel 100, and extends from the display area AA of the display panel 100 to the second fan-out region F2 through the first fan-out region F1 and the bending region ZZ.

It can be understood that, in the display module 200 provided in these embodiments, the first optical adhesive layer 20 that extends to the fan-out regions is used for replacing the MCL adhesive layer, the process of applying the MCL adhesive layer can be omitted, thereby saving resources, reducing costs, and helping to simplify the process. Moreover, because compared to the fluid MCL adhesive layer, the first optical adhesive layer 20 is easier to control, has better thickness uniformity and smaller thickness, a width of a lower frame (i.e., a frame on a side where the bending region is located) of the display module 200 can be effectively reduced compared with using the MCL adhesive layer, which is favorable for realizing a narrow frame. In addition, because the thickness of the first optical adhesive layer 20 is relatively small, a bending radius of the display panel 100 can be flexibly set, and signal lines in the bending region ZZ are prevented from being subjected to too large tensile stress, thereby being beneficial to preventing the signal lines in the bending region ZZ of the display panel 100 from being broken.

In addition, referring to FIG. 11, the signal line (first-type signal line) in the bending region ZZ is located between the first substrate 11 and the second substrate 12. The connecting lead L1 is brought closer to the neutral layer (i.e., the layer in which no strain is generated in bending). The tensile stress applied to the connecting lead L1 in the bending region ZZ during the bending process of the display panel 100 is reduced, so that the risk of breakage of the connecting lead L1 is reduced, and the yield of the display panel 100 is improved. In FIG. 11, the first-type signal line L2 is not shown, and conductive layers between the gate insulating layer, a planarization layer PLN, and a pixel definition layer PDL are also not shown. Also, the planarization layer PLN shown in FIG. 11 may be of a single layer or multiple layers.

For example, a material of the first optical adhesive layer 20 may be OCA (optical clear adhesive).

In some embodiments, with continued reference to FIG. 9, the display panel 100 further includes a fifth edge H5 located at a side of the second fan-out region F2 away from the bending region ZZ; the first optical adhesive layer 20 includes a sixth edge H6 proximate to the fifth edge H5; and a distance D1 between an orthographic projection of the sixth edge H6 on the display panel 100 and the fifth edge H5 is in a range of 0.1 mm to 0.25 mm, inclusive.

In these embodiments, on the basis of extending the first optical adhesive layer 20 outwards, an extent of extension of the first optical adhesive layer 20 is limited, so that the distance is formed between the orthographic projection of the sixth edge H6 of the first optical adhesive layer 20 on the display panel 100 and the fifth edge H5 of the display panel 100, and the first optical adhesive layer 20 is prevented from overflowing to the outside of the display panel 100, which affects the quality of the display module 200. In a case where the distance D1 between the orthographic projection of the sixth edge H6 of the first optical adhesive layer 20 on the display panel 100 and the fifth edge H5 of the display panel 100 is equal to or approximately 0.1 mm, the first optical adhesive layer 20 can be prevented from overflowing to the outside of the display panel 100, and the bending region ZZ of the display panel 100 can be covered in all directions, so that the signal line in the bending region ZZ of the display panel 100 is prevented from being broken. In a case where the distance D1 between the orthographic projection of the sixth edge H6 of the first optical adhesive layer 20 on the display panel 100 and the fifth edge H5 of the display panel 100 is equal to or approximately 0.25 mm, the bending region ZZ of the display panel 100 can be covered, so as to prevent the signal line in the bending region ZZ of the display panel 100 from being broken, and a large distance can effectively prevent the first optical adhesive layer 20 from overflowing to the outside of the display panel 100.

For example, the distance D1 between the orthographic projection of the sixth edge H6 of the first optical adhesive layer 20 on the display panel 100 and the fifth edge H5 of the display panel 100 may be any one of 0.1 mm, 0.15 mm, 0.2 mm, or 0.25 mm.

In addition, it will be noted that in these embodiments, the orthographic projection of the sixth edge H6 of the first optical adhesive layer 20 on the display panel 100 is illustrated as being located inside the display panel 100. In some other embodiments, orthographic projections of other edges of the first optical adhesive layer 20 on the display panel 100 may also be located inside the display panel 100. In some still other embodiments, other edges of the first optical adhesive layer 20 may be flush with corresponding edges of the display panel 100. That is, positions of other edges of the first optical adhesive layer 20 in embodiments of the present disclosure may be flexibly set according to requirements.

Figure 12:
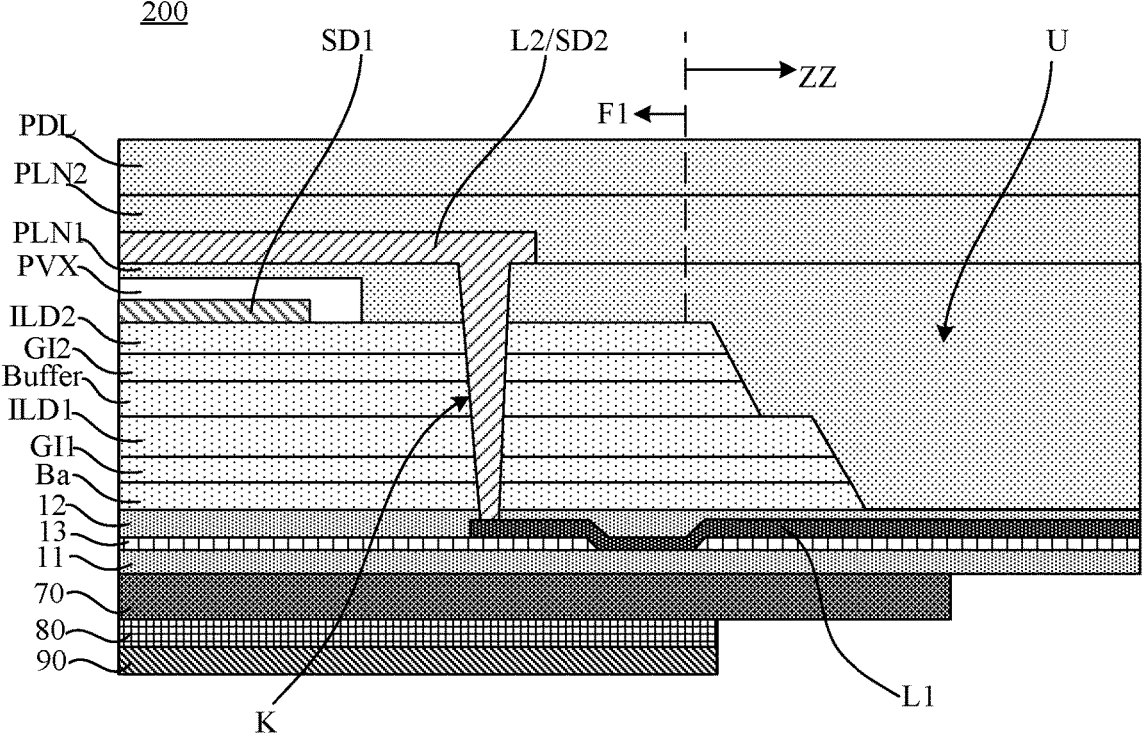
FIG. 12 is a section view of a display module provided in some still other embodiments of the present disclosure.

FIG. 12 is a section view of a display module provided in some still other embodiments of the present disclosure. In some embodiments, referring to FIG. 12, a display panel 100 of the display module 200 includes a plurality of insulating layers stacked on the substrate layer 10, which include a barrier layer Ba, a first gate insulating layer GI1, a first interlayer dielectric layer ILD1, another buffer layer Buffer, a second gate insulating layer GI2, a second interlayer dielectric layer ILD2, a passivation layer PVX, a first planarization layer PLN1, and a second planarization layer PLN 2. The barrier layer Ba, the first gate insulating layer GI1, the first interlayer dielectric layer ILD1, the buffer layer Buffer, the second gate insulating layer GI2, the second interlayer dielectric layer ILD2, the first planarization layer PLN1, and the second planarization layer PLN2 each extend into the bending region ZZ. A portion of the plurality of insulating layers located in the bending region ZZ may be provided therein with a trench U, so that the problem that the insulating layers are broken when bent may be prevented, and the yield of the display panel 100 is improved.

For example, the barrier layer Ba, the first gate insulating layer GI1, the first interlayer dielectric layer ILD1, the buffer layer Buffer, the second gate insulating layer GI2, the second interlayer dielectric layer ILD2, the passivation layer PVX, the first planarization layer PLN1, and the second planarization layer PLN2 are arranged in a stack in sequence and arranged on the substrate layer 10.

FIG. 12 shows an example in which the first-type signal line L2 is located in the second source-drain metal layer SD2 between the first planarization layer PLN1 and the second planarization layer PLN2, and the first-type signal line L2 is electrically connected to the connecting lead L1 through the via hole K. In some other embodiments, the first-type signal line L2 may be located in the first source-drain metal layer SD1 between the second interlayer dielectric layer ILD2 and the passivation layer PVX, and the first-type signal line L2 is electrically connected to the connecting lead L1 through the via hole K.

Figure 13:
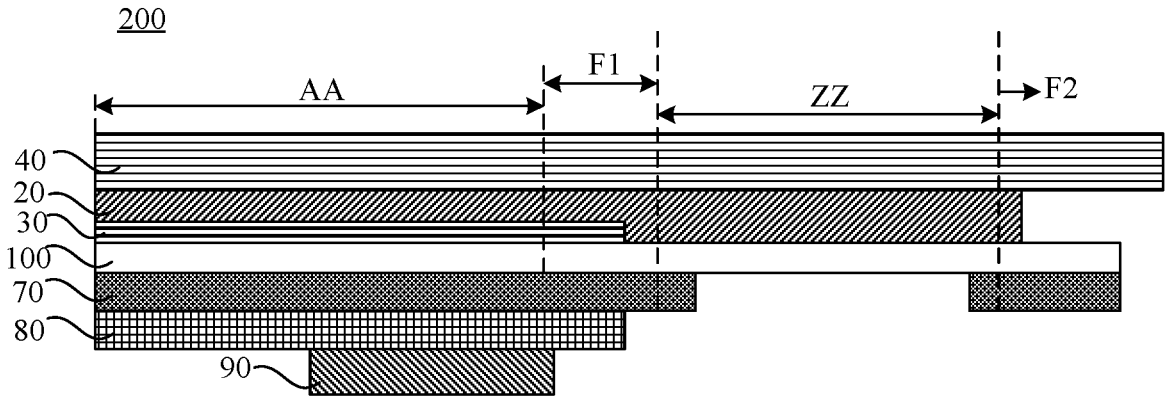
FIG. 13 is a section view of a display module provided in some still other embodiments of the present disclosure.
Figure 14:
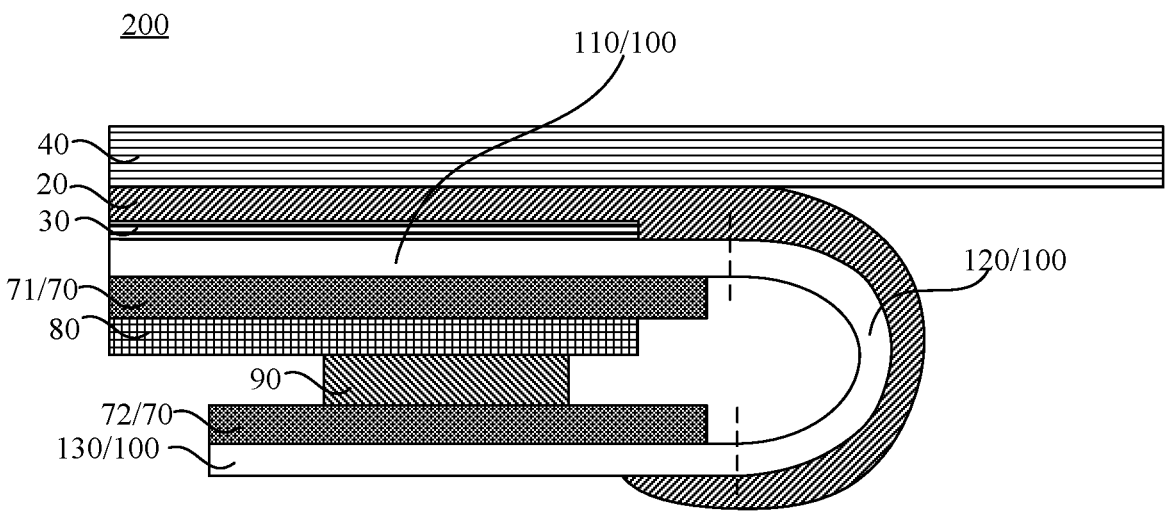
FIG. 14 is a section view of a display module provided in some still other embodiments of the present disclosure.

FIG. 13 is a section view of a display module provided in some still other embodiments of the present disclosure. FIG. 14 is a section view of a display module provided in some still other embodiments of the present disclosure. A display panel 100 in the display module 200 as shown in FIG. 13 is in an unbent state, and a display panel 100 in the display module 200 as shown in FIG. 14 is in a bent state. In some embodiments, referring to FIGS. 13 and 14, the display module 200 further includes a color filter layer 30 and a protective cover plate 40.

The protective cover plate 40 is located on a side of the first optical adhesive layer 20 away from the display panel 100. The protective cover plate 40 serves to protect the display panel 100 and to improve the overall impact resistance of the display device 300. For example, a material of the protective cover plate 40 includes at least one of transparent polyimide or ultra-thin glass.

The color filter layer 30 is located between the display panel 100 and the first optical adhesive layer 20, and at least the display area AA is within an orthographic projection of the color filter layer 30 on the display panel 100. It can be understood that the color filter layer 30 is directly formed on an encapsulation layer of the display panel 100 to form a COE (color filter on encapsulation) structure. The display module 200 with the COE structure does not need to adopt a polarizer, which is favorable for reducing the cost of the display module 200. Moreover, without the polarizer, a screen power consumption can be lower under a same display brightness. And, compared with using the polarizer, a thickness of the display module may be significantly reduced, which is conducive to the realization of the thinness of the display module 200.

In some examples, the color filter layer 30 includes a plurality of color filter portions and a separation pattern for separating the plurality of color filter portions. The plurality of color filter portions include red color filter portions, green color filter portions, and blue color filter portions.

For example, the separation pattern is made of a black light absorbing material.

Figure 15:
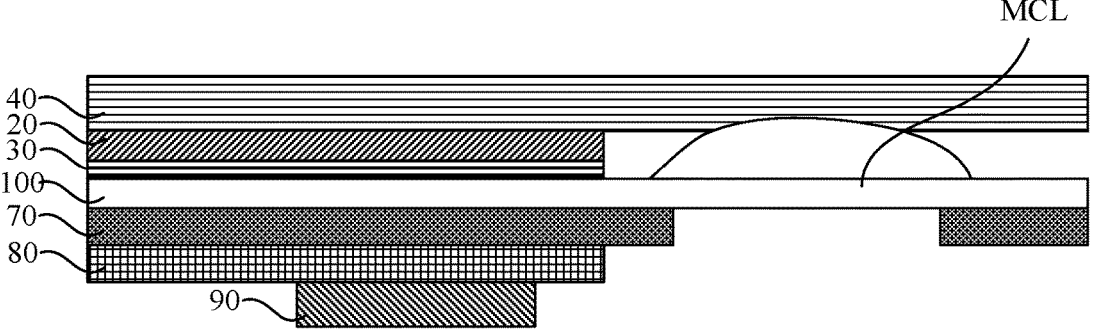
FIG. 15 is a section view of a display module in some still other implementations.
Figure 16:
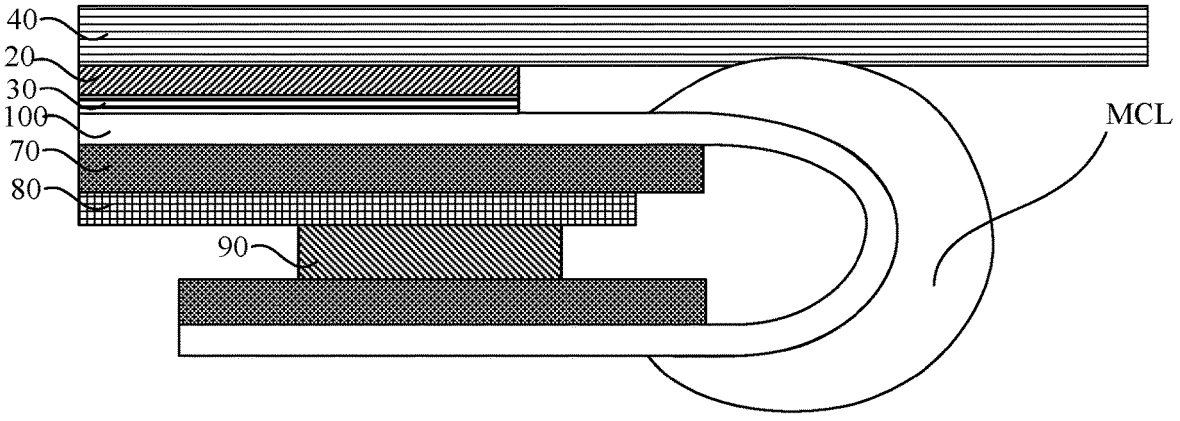
FIG. 16 is a section view of a display module in some still other implementations.

FIG. 15 is a section view of a display module in some still other implementations. FIG. 16 is a section view of a display module in some still other implementations. A display panel 100 in the display module 200 as shown in FIG. 15 is in an unbent state, and a display panel 100 in the display module 200 as shown in FIG. 16 is in a bent state. In some of the above implementations, referring to FIGS. 15 and 16, based on the COE structure, no polarizer is required. Only a single first optical adhesive layer 20 is arranged between a protective cover plate 40 and a display panel 100. Since a thickness of the MCL adhesive layer is much greater than a thickness of the first optical adhesive layer 20, this results in an interference between the MCL adhesive layer and the protective cover plate 40 after the MCL adhesive layer is applied, thus affecting the quality of the protective cover plate 40.

In the display module 200 provided in these embodiments, the first optical adhesive layer 20 that extends to the fan-out regions is used for replacing the MCL adhesive layer. Since the first optical adhesive layer 20 has better thickness uniformity and smaller thickness compared with the fluid MCL adhesive layer, the first optical adhesive layer 20 does not interfere with the protective cover plate 40, thereby improving the quality of the display module 200. In addition, compared with using the MCL adhesive layer, the first optical adhesive layer 20 may effectively reduce a width of a lower frame of the display module 200, which is conducive to achieving a narrow frame. Moreover, since the thickness is small, the bending radius of the display panel 100 can be flexibly set, and the signal line in the bending region ZZ is prevented from being subjected to overlarge tensile stress, thereby being beneficial to preventing the signal line in the bending region ZZ of the display panel 100 from being broken.

Figure 17:
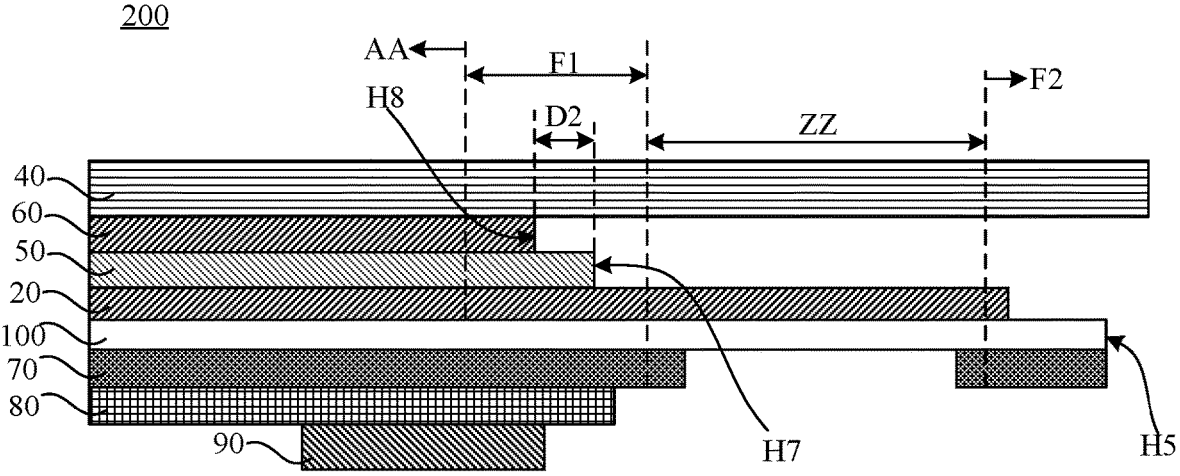
FIG. 17 is a section view of a display module provided in some still other embodiments of the present disclosure.
Figure 18:
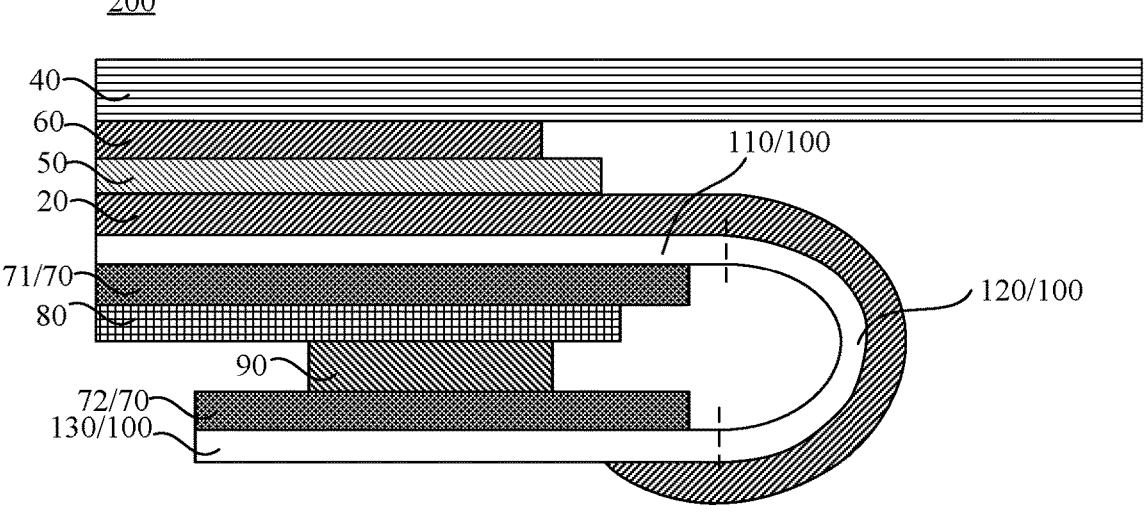
FIG. 18 is a section view of a display module provided in some still other embodiments of the present disclosure.

FIG. 17 is a section view of a display module provided in some still other embodiments of the present disclosure. FIG. 18 is a section view of a display module provided in some still other embodiments of the present disclosure. A display panel 100 in the display module 200 as shown in FIG. 17 is in an unbent state, and a display panel 100 in the display module 200 as shown in FIG. 18 is in a bent state. In some embodiments, referring to FIGS. 17 and 18, the display module 200 further includes a protective cover plate 40, a polarizer 50, and a second adhesive layer 60.

The polarizer 50 is located on a side of the first adhesive layer 20 away from the display panel 100. The polarizer 50 and the display panel 100 are fixedly bonded by the first optical adhesive layer 20. At least the display area AA is within an orthographic projection of the polarizer 50 on the display panel 100. The polarizer 50 may be a circular polarizer. Here, the polarizer 50 can reduce a reflection of external light, thereby preventing the display module 200 from generating a dazzling effect.

The second optical adhesive layer 60 is located on a side of the polarizer 50 away from the first optical adhesive layer 20. The polarizer 50 and the protective cover plate 40 are fixedly bonded by the second optical adhesive layer 60. For example, a material of the second optical adhesive layer 60 may be OCA (optical clear adhesive). The first optical adhesive layer 20 and the second optical adhesive layer 60 may be made of a same material. It can be understood that in some other embodiments, the first optical adhesive layer 20 and the second optical adhesive layer 60 may be made of different materials.

The protective cover plate 40 is located on a side of the second optical adhesive layer 60 away from the polarizer 50. The protective cover plate 40 serves to protect the display panel 100 and to improve the overall impact resistance of the display device 300. For example, a material of the protective cover plate 40 includes at least one of transparent polyimide or ultra-thin glass.

In some embodiments, with continued reference to FIG. 17, in a case where the display panel 100 further includes the fifth edge H5 located at the side of the second fan-out region F2 away from the bending region ZZ, the polarizer 50 includes a seventh edge H7 proximate to the fifth edge H5; the second optical adhesive layer 60 includes an eighth edge H8 proximate to the fifth edge H5; the eighth edge H8 is closer to the display area AA than the seventh edge H7; and a distance D2 between an orthographic projection of the seventh edge H7 on the display panel 100 and an orthographic projection of the eighth edge H8 on the display panel 100 is in a range of 0.1 mm to 0.25 mm, inclusive.

In these embodiments, the distance is provided between the orthographic projection of the eighth edge H8 of the second optical adhesive layer 60 on the display panel 100 and the orthographic projection of the seventh edge H7 of the polarizer 50 on the display panel 100, that is, the second optical adhesive layer 60 is "retracted" with respect to the polarizer 50 by the distance, so as to prevent the second optical adhesive layer 60 from overflowing to an outer side of the polarizer 50, which affects the quality of the display module 200. In a case where the distance D2 between the orthographic projection of the eighth edge H8 of the second optical adhesive layer 60 on the display panel 100 and the orthographic projection of the seventh edge H7 of the polarizer 50 on the display panel 100 is equal to or approximately 0.1 mm, the protective cover plate 40 and the polarizer 50 can be better fixedly bonded while the second optical adhesive layer 60 is prevented from overflowing to the outer side of the polarizer 50. In a case where the distance D2 between the orthographic projection of the eighth edge H8 of the second optical adhesive layer 60 on the display panel 100 and the orthographic projection of the seventh edge H7 of the polarizer 50 on the display panel 100 is equal to or approximately 0.25 mm, the large distance may be set on the basis of fixedly bonding the protective cover plate 40 and the polarizer 50, the second optical adhesive layer 60 is more effectively prevented from overflowing to the outer side of the polarizer 50, and the quality of the display module 200 is ensured.

For example, the distance D2 between the orthographic projection of the eighth edge H8 of the second optical adhesive layer 60 on the display panel 100 and the orthographic projection of the seventh edge H7 of the polarizer 50 on the display panel 100 may be any one of 0.1 mm, 0.15 mm, 0.2 mm, or 0.25 mm.

In addition, it will be noted that in these embodiments, the orthographic projection of the eighth edge H8 of the second optical adhesive layer 60 on the display panel 100 is illustrated as being located within an orthographic projection of the polarizer 50 on the display panel 100. In some other embodiments, orthographic projections of other edges of the second optical adhesive layer 60 on the display panel 100 may also be located within the orthographic projection of the polarizer 50 on the display panel 100. In some still other embodiments, other edges of the second optical adhesive layer 60 may be flush with corresponding edges of the polarizer 50. That is, positions of other edges of the second optical adhesive layer 60 in embodiments of the present disclosure may be flexibly set according to requirements.

In some embodiments, with continued reference to FIG. 10, and also referring to FIG. 14 or FIG. 18. The display panel 100 includes a first portion 110 located in the display area AA and the first fan-out region, a second portion 120 located in the bending region ZZ, and a third portion 130 located in the display area AA and the second fan-out region. The second portion 120 is connected between the first portion 110 and the third portion 130. After the display panel 100 is bent, the first portion 110 is opposite to the third portion 130. The display module 200 further includes a back film 70, a support layer 80, and a bending cushion block 90.

The back film 70 is located on a non-display side of the display panel 100, and the non-display side is opposite to the display side. The back film 70 includes a first sub-film 71 and a second sub-film 72. The first sub-film 71 covers at least the first portion 110, the second sub-film 72 covers at least the third portion 130, and a gap F is formed between the first sub-film 71 and the second sub-film 72. In a direction perpendicular to the second portion 120, the gap at least partially overlaps the bending region ZZ. The back film 70 may support the display panel 100 to some extent.

After the display panel 100 is bent, the support layer 80 is located between the first sub-film 71 and the second sub-film 72. The support layer 80 is located between the first sub-film 71 and the bending cushion block 90. After bending, the support layer 80, between the first sub-film 71 and the bending cushion block 90, is also located between the first sub-film 71 and the second sub-film 72. For example, the support layer 80 may be made of metal. For example, a material of the support layer 80 may be a metal material such as stainless SUS, copper, or a titanium alloy.

After the display panel 100 is bent, the bending cushion block 90 is located between the support layer 80 and the second sub-film 72. After the third portion 130 of the display panel 100 is placed on the non-display side, the bending cushion block 90 is located between the support layer 80 and the second sub-film 72 to support the second sub-film 72 and the support layer 80, so as to avoid the second sub-film 72 to appear overhanging after the display panel is bent, and improve the stability of the display module 200.

Figure 19:
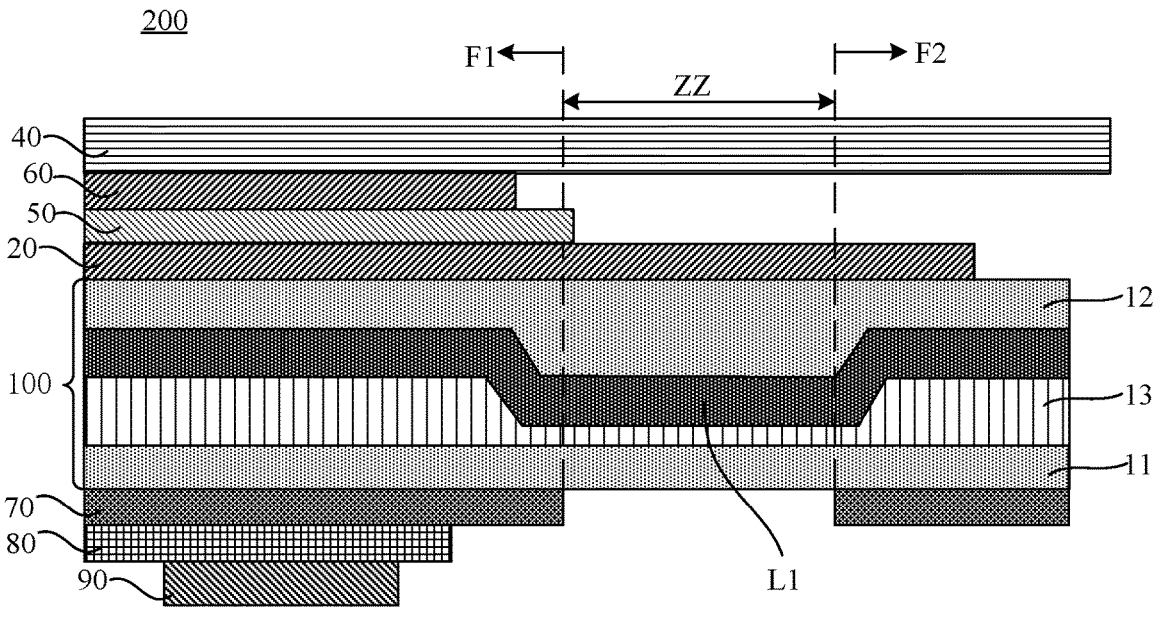
FIG. 19 is a section view of a display module provided in some still other embodiments of the present disclosure.

FIG. 19 is a section view of a display module provided in some still other embodiments of the present disclosure. FIG. 19 shows an arrangement manner of structures within a display panel in the display module as shown in FIG. 9 in detail. In some embodiments, in conjunction with FIG. 11, one or more layers of planarization layers PLN and/or the pixel definition layer PDL in the display module 200 as shown in FIG. 11 are removed. FIG. 19 shows an example in which the planarization layers PLN and the pixel definition layer PDL are removed in the display module 200.

A thickness of a planarization layer PLN is much less than that of the substrate layer 10, a thickness of the pixel definition layer PDL is much less than that of the substrate layer 10; an elastic modulus of the planarization layer PLN is less than that of the first substrate 11, and less than that of the second substrate 12; and an elastic modulus of the pixel definition layer PDL is less than that of the first substrate 11, and less than that of the second substrate 12. Therefore, removing at least one of the planarization layer PLN and the pixel definition layer PDL has less effect on a position of the neutral layer in the display module 200. In addition, removing the at least one of the planarization layer PLN and the pixel definition layer PDL may reduce the number of masks used and simplify the process of the display module 200.

In a case where the display module 200 does not include one or more layers of the planarization layers PLN, the display module 200 includes a single source-drain metal layer. In a case where the display module 200 does not include the pixel definition layer PDL, the light-emitting elements may be independently disposed. And in this case, the insulating layer may not be provided with a via hole in the bending region ZZ. The present disclosure is not limited thereto.

Figure 20:
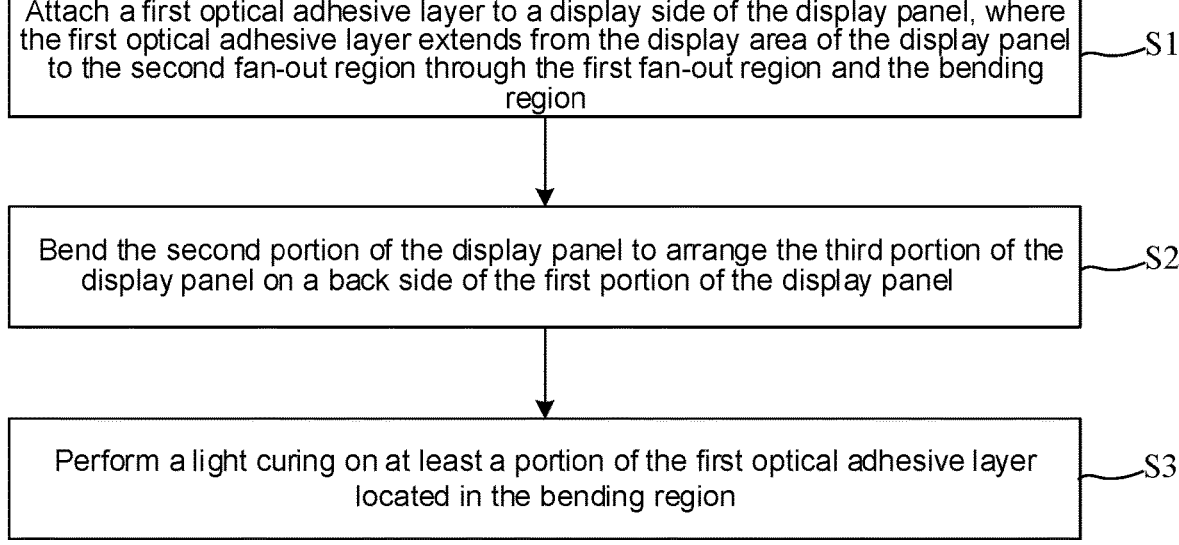
FIG. 20 is a flow diagram of a manufacturing method of a display module provided in some embodiments of the present disclosure.
Figure 21:
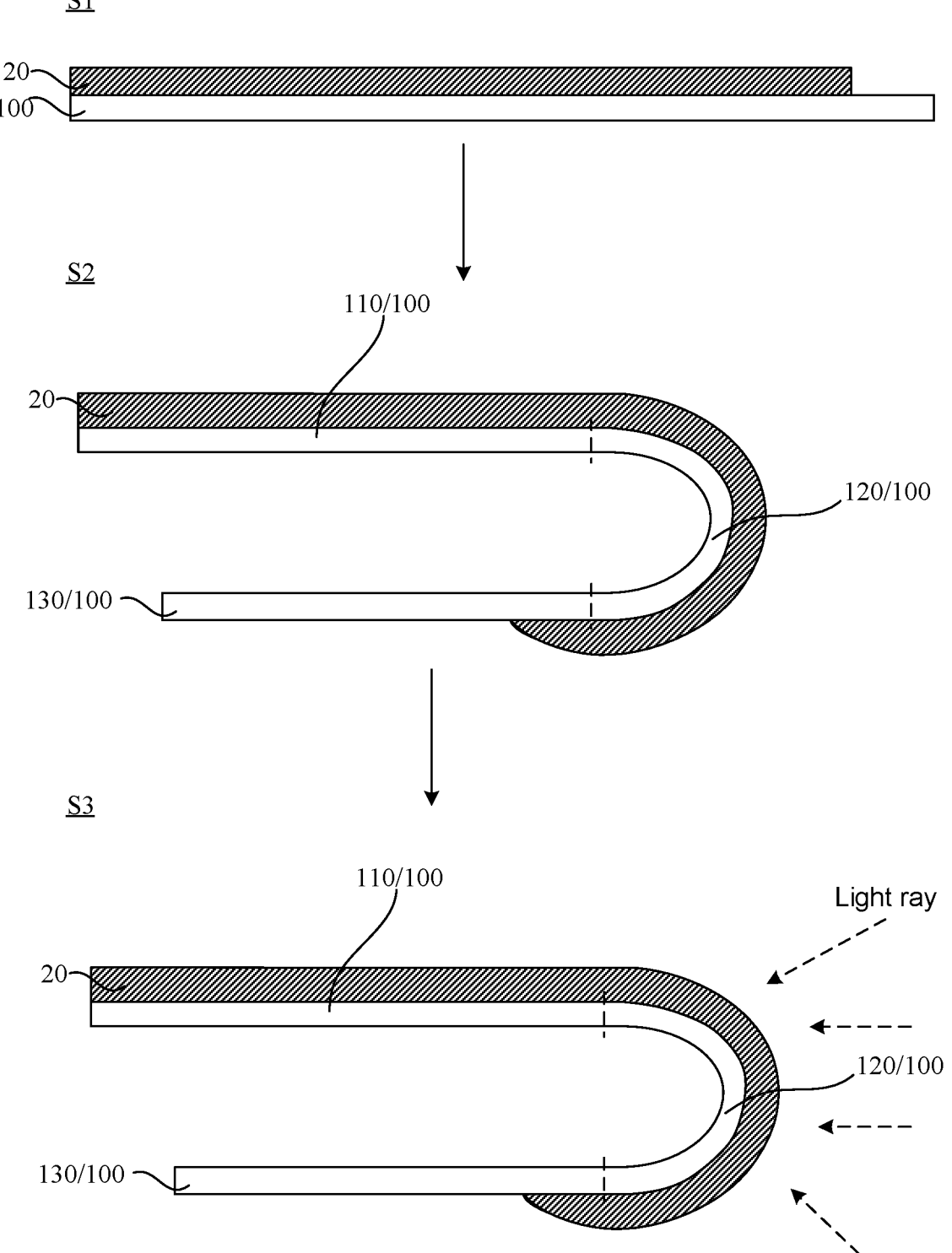
FIG. 21 is a diagram showing structures corresponding to some steps in FIG. 20.

FIG. 20 is a flow diagram of a manufacturing method of a display module provided in some embodiments of the present disclosure. FIG. 21 is a diagram showing structures corresponding to some steps in FIG. 20. some embodiments of the present disclosure provide the manufacturing method of the display module, referring to FIGS. 20 and 21, a display panel 100 includes a first portion 110 located at a side of a bending region ZZ proximate to a display area AA, a second portion 120 located in the bending region ZZ, and a third portion 130 located at a side of the bending region ZZ away from the display area AA.

The method includes the following steps.

In step S1, a first optical adhesive layer is attached to a display side of the display panel, and the first optical adhesive layer extends from the display area of the display panel to the second fan-out region through the first fan-out region and the bending region.

In step S1, the first optical adhesive layer 20 is attached to the display side of the display panel 100. The first optical adhesive layer is arranged to extend from the display area AA of the display panel to the second fan-out region F2 through the first fan-out region F1 and the bending region ZZ. The first optical adhesive layer 20 that extends to the fan-out regions is used for replacing the MCL adhesive layer, the process of applying the MCL adhesive layer can be omitted, thereby saving resources, reducing costs, and helping to simplify the process. Moreover, since the first optical adhesive layer 20 is an adhesive strip, it can be directly attached, and is easier to control, better in thickness uniformity, and thinner compared with applying the fluid MCL adhesive layer. That is, the first optical adhesive layer 20 can effectively reduce a width of a lower frame of the display module 200 compared with using the MCL adhesive layer, which is favorable for realizing a narrow frame. Moreover, because a thickness of the first optical adhesive layer 20 is relatively small, a bending radius of the display panel 100 can be flexibly set, and a signal line in the bending region ZZ is prevented from being subjected to too large tensile stress, thereby being beneficial to preventing the signal line in the bending region ZZ of the display panel 100 from being broken.

For example, a material of the first optical adhesive layer 20 may be OCA (optical clear adhesive).

In step S2, the second portion of the display panel is bent to arrange the third portion of the display panel on a back side of the first portion of the display panel.

In step S2, the second portion 120 of the display panel 100 is bent, and the third portion 130 of the display panel 100 is arranged to the back side of the first portion 110 of the display panel 100.

S3: a light curing is performed on at least a portion of the first optical adhesive layer located in the bending region.

In step S3, at least the portion of the first optical adhesive layer 20 located in the bending region ZZ is cured by light ray. Both sides of the first optical adhesive layer 20 have adhesiveness, a side of the first optical adhesive layer 20 proximate to the display panel 100 is fixedly bonded to the display panel 100. A portion, located in the bending region, of a side of the first optical adhesive layer 20 away from the display panel 100 is in a overhanging state. Performing the light curing on at least the portion of the first optical adhesive layer 20 located in the bending region can reduce adhesion force of the first optical adhesive layer 20 at this position, prevent foreign objects from bonding with the portion of the first optical adhesive layer 20 located in the bending region, and improve the quality of the display module 200.

FIG. 21 mainly shows that the portion of the first optical adhesive layer located in the bending region is cured by light ray, and other structures in the display module 200 are not shown. In some embodiments, other structures in the display module may be formed through subsequent processes. For example, the color filter layer 30 (or the polarizer 50), the protective cover plate 40, the back film 70, the support layer 80, and the bending cushion block 90 in the display module are formed.

The foregoing descriptions are merely specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, having a display area and a peripheral area, wherein the peripheral area includes: a first fan-out region, a bending region, and a second fan-out region that are arranged on a same side of the display area and away from the display area in sequence; the display panel comprises:

a substrate layer, covering the display area and the peripheral area and including a first substrate and a second substrate arranged in a stack;

at least one connecting lead, located between the first substrate and the second substrate and extending from a side of the bending region proximate to the first fan-out region to a side of the bending region proximate to the second fan-out region through the bending region; and at least one first-type signal line, located on a side of the second substrate away from the first substrate, wherein a first-type signal line is located in at least one of the first fan-out region or the display area, and the first-type signal line is electrically connected to a connecting lead through a via hole in the second substrate.

2. The display panel according to claim 1, wherein the substrate layer further includes:

a buffer layer arranged between the first substrate and the second substrate, wherein the connecting lead is located between the buffer layer and the second substrate.

3. The display panel according to claim 2, wherein the buffer layer has an accommodating structure, wherein the accommodating structure has an opening provided in a surface of the buffer layer facing the second substrate, at least a portion of the accommodating structure is located in the bending region, and at least a portion of the connecting lead is located in the accommodating structure.

4. The display panel according to claim 3, wherein the accommodating structure further has another opening provided in a surface of the buffer layer facing the first substrate.

5. The display panel according to claim 4, wherein the accommodating structure includes a first side wall and a second side wall, wherein the first side wall is proximate to the first fan-out region, the second side wall is proximate to the second fan-out region, and the first side wall and the second side wall define an accommodating groove, wherein the at least a portion of the connecting lead is located in the accommodating groove and is in contact with the first side wall, the second side wall and a portion of the first substrate exposed by the accommodating groove.

6. The display panel according to claim 5, wherein an edge of the first side wall proximate to the first substrate is a first edge, and an edge of the first side wall away from the first substrate is a second edge; and an edge of the second side wall proximate to the first substrate is a third edge, and an edge of the second side wall away from the first substrate is a fourth edge, wherein a distance between the second edge and the fourth edge is greater than a distance between the first edge and the third edge.

7. The display panel according to claim 1, wherein a surface of the second substrate away from the first substrate is a flat plane.

8. The display panel according to claim 1, further comprising:

at least one gate metal layer, at least one source-drain metal layer and an anode layer that are located on the substrate layer, wherein the first-type signal line is located in any one of the at least one gate metal layer, the at least one source-drain metal layer and the anode layer.

9. The display panel according to claim 1, further comprising:

at least one second-type signal line, located on a side of the second substrate away from the first substrate and located in the second fan-out region, wherein a second-type signal line is electrically connected to the connecting lead through another via hole in the second substrate.

10. The display panel according to claim 1, wherein a thickness of the first substrate is in a range of 8 μm to 10 μm, inclusive; and/or a thickness of the second substrate is in a range of 5 μm to 10 μm, inclusive.

11. A display module, comprising:

the display panel according to claim 1; and a first optical adhesive layer, located on a display side of the display panel, wherein the first optical adhesive layer extends from the display area of the display panel to the second fan-out region through the first fan-out region and the bending region.

12. The display module according to claim 11, wherein the display panel further includes a fifth edge located at a side of the second fan-out region away from the bending region, and the first optical adhesive layer includes a sixth edge proximate to the fifth edge, wherein a distance between an orthographic projection of the sixth edge on the display panel and the fifth edge is in a range of 0.1 mm to 0.25 mm, inclusive.

13. The display module according to claim 11, further comprising:

a color filter layer, located between the display panel and the first optical adhesive layer, wherein at least the display area is within an orthographic projection of the color filter layer on the display panel; and a protective cover plate, located on a side of the first optical adhesive layer away from the display panel.

14. The display module according to claim 11, further comprising:

a polarizer, located on a side of the first optical adhesive layer away from the display panel, wherein at least the display area is within an orthographic projection of the polarizer on the display panel;

a second optical adhesive layer, located on a side of the polarizer away from the first optical adhesive layer; and a protective cover plate, located on a side of the second optical adhesive layer away from the polarizer.

15. The display module according to claim 14, wherein, the display panel further includes a fifth edge located a side of the second fan-out region away from the bending region; and the polarizer includes a seventh edge proximate to the fifth edge, and the second optical adhesive layer includes an eighth edge proximate to the fifth edge, wherein the eighth edge is closer to the display area than the seventh edge, and a distance between an orthographic projection of the seventh edge on the display panel and an orthographic projection of the eighth edge on the display panel is in a range of 0.1 mm to 0.25 mm, inclusive.

16. The display module according to claim 11, wherein the display panel includes a first portion located in the display area and the first fan-out region, a second portion located in the bending region, and a third portion located in the second fan-out region, wherein the second portion is connected between the first portion and the third portion, and the first portion is arranged opposite to the third portion; the display module further comprises:

a back film, located on a non-display side of the display panel, wherein the non-display side is a side opposite to the display side; the back film includes a first sub-film and a second sub-film, wherein the first sub-film at least covers the first portion, and the second sub-film at least covers the third portion; and the first sub-film and the second sub-film have a gap therebetween, and in a direction perpendicular to the second portion, the gap at least partially overlaps the bending region;

a support layer, located between the first sub-film and the second sub-film; and a bending cushion block, located between the support layer and the second sub-film.

17. A display device, comprising:

the display module according to claim 11.

18. The display panel according to claim 1, wherein the first-type signal line is a data signal line, or a power signal line, or a touch lead.

19. The display panel according to claim 5, wherein the first side wall have slope angles being equal at various positions, and the second side wall have slope angles being equal at various positions.

* * * * *